United States Patent
Sekito et al.

(10) Patent No.: US 12,242,195 B2
(45) Date of Patent: Mar. 4, 2025

(54) METHOD FOR MANUFACTURING CURED FILM AND USE OF THE SAME

(71) Applicant: Merck Patent GmbH, Darmstadt (DE)

(72) Inventors: Takashi Sekito, Kakegawa (JP);
Shigemasa Nakasugi, Yamato (JP);
Hiroshi Yanagita, Kakegawa (JP);
Taku Hirayama, Kakegawa (JP)

(73) Assignee: Merck Patent GmbH, Darmstadt (DE)

( * ) Notice: Subject to any disclaimer, the term of this patent is extended or adjusted under 35 U.S.C. 154(b) by 518 days.

(21) Appl. No.: 17/605,852

(22) PCT Filed: Apr. 24, 2020

(86) PCT No.: PCT/EP2020/061460
§ 371 (c)(1),
(2) Date: Oct. 22, 2021

(87) PCT Pub. No.: WO2020/216899
PCT Pub. Date: Oct. 29, 2020

(65) Prior Publication Data
US 2022/0221794 A1    Jul. 14, 2022

(30) Foreign Application Priority Data
Apr. 26, 2019 (JP) ................................. 2019-085991
Oct. 10, 2019 (JP) ................................. 2019-186781

(51) Int. Cl.
G03F 7/11       (2006.01)
C08G 61/10      (2006.01)
C09D 165/00     (2006.01)
G03F 7/09       (2006.01)

(52) U.S. Cl.
CPC .............. *G03F 7/11* (2013.01); *C08G 61/10* (2013.01); *C09D 165/00* (2013.01); *G03F 7/094* (2013.01); *C08G 2261/124* (2013.01); *C08G 2261/1424* (2013.01); *C08G 2261/18* (2013.01); *C08G 2261/228* (2013.01); *C08G 2261/312* (2013.01); *C08G 2261/3142* (2013.01)

(58) Field of Classification Search
None
See application file for complete search history.

(56) References Cited

U.S. PATENT DOCUMENTS

| | | | | |
|---|---|---|---|---|
| 9,687,793 | B2* | 6/2017 | Hariyama | B01D 71/38 |
| 9,804,492 | B2* | 10/2017 | Hatakeyama | H01L 21/31122 |
| 9,902,675 | B2* | 2/2018 | Shiota | C07C 57/50 |
| 2009/0129829 | A1 | 5/2009 | Saito | |
| 2012/0322010 | A1* | 12/2012 | Paulasaari | C08G 8/02 528/125 |
| 2014/0170405 | A1* | 6/2014 | Makino | C08G 61/124 526/261 |
| 2016/0314984 | A1* | 10/2016 | Matsumura | C08G 8/30 |
| 2018/0050973 | A1 | 2/2018 | Shiota et al. | |
| 2020/0124966 | A1 | 4/2020 | Endo et al. | |

FOREIGN PATENT DOCUMENTS

| | | |
|---|---|---|
| EP | 2894185 | 7/2015 |
| EP | 2980059 A1 | 2/2016 |
| JP | 2008-231174 | 10/2008 |
| JP | 2013-177542 A | 9/2013 |
| JP | 5746670 B2 | 7/2015 |
| JP | 2016-206670 A | 12/2016 |
| JP | 2016-206676 A | 12/2016 |
| TW | 201808868 A | 3/2018 |
| WO | 2006/129543 A1 | 12/2006 |
| WO | 2018/115043 | 6/2018 |
| WO | 2018/190380 A1 | 10/2018 |

OTHER PUBLICATIONS

Artamonov et al., "Raman spectroscopy and microhardness of ion-implanted a-C:H-films", Ceramics International, vol. 26, No. 1, Jan. 1, 2000, pp. 29-32.
International Search Report and Written Opinion received for PCT Patent Application No. PCT/EP2020/061460, mailed on Aug. 11, 2020, 12 pages.
International Preliminary Report on Patentability received for PCT Patent Application No. PCT/EP2020/061460, mailed on Nov. 4, 2021, 11 pages.

* cited by examiner

*Primary Examiner* — Sean M DeGuire
*Assistant Examiner* — Andrew Preston Traywick
(74) *Attorney, Agent, or Firm* — Faegre Drinker Biddle & Reath LLP

(57) ABSTRACT

To provide a method for manufacturing a cured film having high film density, high film hardness and high etching resistance. A method for manufacturing a cured film comprising (1) applying a composition (i) above a substrate; (2) forming a hydro-carbon-containing film from the composition (i); and (3) irradiating the hydrocarbon-containing film with plasma, electron beam and/or ion to form a cured film. Use of the cured film.

13 Claims, No Drawings

METHOD FOR MANUFACTURING CURED FILM AND USE OF THE SAME

CROSS-REFERENCE TO RELATED APPLICATIONS

This application is a national stage application (under 35 U.S.C. § 371) of PCT/EP2020/061460, filed Apr. 24, 2020, which claims benefit of Japanese Application Nos. 2019-085991, filed Apr.; 26, 2019, and 2019-186781, filed Oct. 10, 2019, all of which are incorporated herein by reference in their entirety.

BACKGROUND OF THE INVENTION

Technical Field

The present invention relates to a method for manufacturing a cured film and use of the same.

Background Art

In a process of manufacturing a semiconductor, fine processing by lithographic technique using a photoresist (hereinafter, also simply referred to as the resist) has generally been employed. The fine processing process comprises forming a thin photoresist layer on a semiconductor substrate such as a silicon wafer, covering the layer with a mask pattern corresponding to a desired device pattern, exposing the layer with actinic ray such as ultraviolet ray through the mask, developing the exposed layer to obtain a photoresist pattern, and etching the substrate using the resulting photoresist pattern as a protective film, thereby forming fine unevenness corresponding to the above-described pattern.

In the semiconductor manufacturing, IC chip area is reduced by increasing the amount of transistors per unit area, thereby continuing to reduce the cost per unit transistor. This method is to attempt a finer processing by shortening the wavelength of ultraviolet ray to be irradiated to the photoresist.

Use of ultraviolet ray of single wavelength (for example, KrF light source of 248 nm) causes a problem that the dimensional accuracy of the resist pattern is reduced due to the influence of standing wave. Then, in order to solve this problem, a method for preparing a bottom anti-reflective coating film has been widely studied. The feature required for such a bottom anti-reflective coating film is that the anti-reflective effect is high, and the like.

In order to achieve further finer processing, methods using an ArF light source (193 nm) or EUV (13 nm) have been widely studied. In this case, if the film thickness of the resist is too thick, the resist pattern is likely to collapse or a development residue is likely to be generated. Therefore, there is a problem that a sufficient function of the protective film cannot be obtained only by the resist.

Therefore, a method called multi-layer has been widely used, in which a new protective film is formed as a underlayer of a photoresist, a photoresist pattern is transferred to the underlayer film, and the substrate is etched using the underlayer film as a protective film.

Various types of multi-layer protective film exist, and an amorphous carbon film is sometimes used as the protective film.

As a method for increasing the function of the protective film of carbon film by applying a solution and baking, a method for applying a solution to form a carbon film that can withstand baking at a temperature exceeding the general baking temperature of 450° C., and baking, for example, at 600° C. is mentioned. In addition, the function of the protective film can be improved by increasing the carbon concentration in the solid of the carbon film forming solution, but it is general to trade off with other performances such as solubility.

Under such a technical situation, Patent Document 1 studies a technique of manufacturing a cured film by polymerizing a conductive polymer precursor such as polythiophene by plasma irradiation in order to obtain a film having good heat resistance and moisture resistance.

In order to achieve film formability, solubility in a solvent and heat resistance, Patent Document 2 provides synthesis of a compound, in which a monocyclic hydrocarbon is linked, and its use as a underlayer film. However, there is no description about performing plasma irradiation or electron beam, ion irradiation in the process of forming the film.

Patent Document 3 studies a method for forming a resist underlayer having good etching resistance.

PRIOR ART DOCUMENTS

Patent Documents

[Patent document 1] JP-B 5746670
[Patent document 2] WO 2018/115043
[Patent document 3] JP-A 2016-206676

SUMMARY OF THE INVENTION

Problems to be Solved by the Invention

The present inventors considered that there are one or more problems still need improvements. These include, for example, the followings:

The film density of the cured film is insufficient; the film hardness of the cured film is insufficient; a cured film having an intensity ratio $R=I_D/I_G$ in Raman spectroscopy of 0.35 to 0.9 cannot be obtained; a cured film having a hard structure such as a diamond-like carbon structure cannot be obtained; etching resistance of the film is insufficient; an insulating cured film cannot be obtained; in a solution used, solubility of the solute in a solvent is insufficient; coating properties of the composition is low; the film oxidizes in the process of plasma or electron beam treatment; and the film is lost due to excessive scattering of solid components of the film in the process of plasma or electron beam treatment.

The present inventors have paid attention to the possibility that for the carbon film as the protective film in the lithography process, the function of the protective film can be enhanced by increasing the film density. Therefore, they have considered it useful to form a carbon film containing much sP3 carbon that is the same as diamond. Further, at the same time, they have considered it useful that such a component has high solubility.

As a result of investigation, the present inventors found a manufacturing method that can obtain a high-density film with a large amount of sP3 carbon by treating a film formed from a certain hydrocarbon-containing compound with energy such as plasma or electron beam.

The present invention has been made based on the technical background as described above, and provide a method for manufacturing a cured film comprising (1) applying a composition (i) above a substrate; (2) forming a hydrocarbon-containing film from the composition (i); and (3) irradiating the hydrocarbon-containing film with plasma, electron beam and/or ion to form a cured film.

Means for Solving the Problems

The method for manufacturing a cured film according to the present invention comprises the following processes:
(1) applying a composition (i) above a substrate;
(2) forming a hydrocarbon-containing film from the composition (i); and
(3) irradiating the hydrocarbon-containing film with plasma, electron beam and/or ion to form a cured film, provided that the composition (i) comprises a hydrocarbon-containing compound (A) and a solvent (B); and the hydrocarbon-containing compound (A) comprises a structural unit (A1) represented by the following formula (A1):

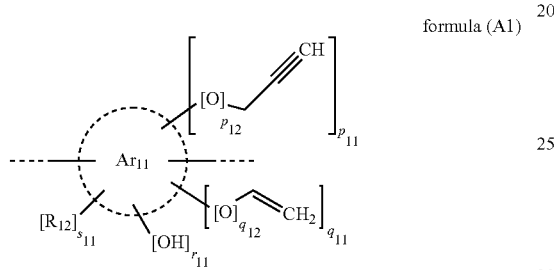

wherein,
$Ar_{11}$ is a $C_{6-60}$ hydrocarbon group substituted with $R_{11}$ or unsubstituted (provided that $Ar_{11}$ contains no fused aromatic ring);
$R_{11}$ is a linear, branched or cyclic $C_{1-20}$ alkyl, amino or alkylamino;
$R_{12}$ is I, Br or CN;
$p_{11}$ is a number of 0 to 5, $p_{12}$ is a number of 0 to 1, $q_{11}$ is a number of 0 to 5, $q_{12}$ is a number of 0 to 1, $r_{11}$ is a number of 0 to 5, $s_{11}$ is a number of 0 to 5; and
$p_{11}$, $q_{11}$ and $r_{11}$ do not become 0 simultaneously in one structural unit.

Further, the present invention provides a carbon-containing cured film, wherein the film density is 1.3 to 3.2 g/cm³; the film hardness is 1.5 to 20 GPa; and/or intensity ratio of G band and D band $R=I_D/I_G$ in Raman spectroscopy (measured with laser wavelength of 514.5 nm) is 0.35 to 0.90.

Further, the present invention provides a method for manufacturing a resist layer above the above-described cured film. Further, the present invention provides a method for manufacturing a resist pattern by exposing and developing the above-described resist layer. Further, the present invention provides a method for manufacturing a device comprising the method according to either of the above.

Effects of the Invention

Using the method for manufacturing a cured film of the present invention, it is possible to desire one or more of the following effects.
A cured film having a high film density can be obtained; a cured film having a high film hardness can be obtained; a cured film having an intensity ratio $R=I_D/I_G$ in Raman spectroscopy of 0.35 to 0.9 can be obtained; a cured film having a diamond-like carbon structure can be obtained; a film having high etching resistance can be obtained; an insulating cured film can be obtained; in the composition used, solubility of a solute in a solvent is good; coating properties of the composition is high; oxidation of the film in the process of plasma or electron beam treatment can be prevented; and losing the film due to excessive scattering of solid components of the film in the process of plasma or electron beam treatment can be prevented.

Since it is possible to have these advantageous characteristics, the cured film according to the present invention can be applied to the manufacturing process of fine devices, and can be applied to the manufacture of preferably semiconductors, more preferably DRAM and 3D NAND. The cured film of the present invention is effective also as SOC (Spin on carbon) for hard mask and core material SOC.

DETAILED DESCRIPTION OF THE INVENTION

Mode for Carrying Out the Invention

Embodiments of the present invention are described below in detail.

Definitions

Unless otherwise specified in the present specification, the definitions and examples described in this paragraph are followed.

The singular form includes the plural form and "one" or "that" means "at least one". An element of a concept can be expressed by a plurality of species, and when the amount (for example, mass % or mol %) is described, it means sum of the plurality of species.

"And/or" includes a combination of all elements and also includes single use of the element.

When a numerical range is indicated using "to" or "-", it includes both endpoints and units thereof are common. For example, 5 to 25 mol % means 5 mol % or more and 25 mol % or less.

The descriptions such as "$C_{x-y}$", "$C_x$-$C_y$" and "$C_x$" mean the number of carbons in a molecule or substituent. For example, $C_{1-6}$ alkyl means an alkyl chain having 1 or more and 6 or less carbons (methyl, ethyl, propyl, butyl, pentyl, hexyl etc.).

When polymer has a plural types of repeating units, these repeating units copolymerize. These copolymerization may be any of alternating copolymerization, random copolymerization, block copolymerization, graft copolymerization, or a mixture thereof. When polymer or resin is represented by a structural formula, n, m or the like that is attached next to parentheses indicate the number of repetitions.

Celsius is used as the temperature unit. For example, degrees means 20 degrees Celsius.

The additive refers to a compound itself having a function thereof (for example, in the case of a base generator, the compound itself that generates a base). An aspect in which the compound is dissolved or dispersed in a solvent and added to the composition is also possible. As one embodiment of the present invention, it is preferable that such a solvent is contained in the composition according to the present invention as the solvent (B) or another component.

As those constructing a part of the present specification, all of the descriptions of WO 2018/115043, International Patent Application No. PCT/EP2018/079621 (filed on Oct. 30, 2018), International Patent Application No. PCT/EP2018/085147 (filed on Dec. 17, 2018), and European Patent Application No. 18199921.3 (filed on Oct. 5, 2018) are incorporated by reference.

Composition

The method for manufacturing a cured film according to the present invention comprises the following processes:

(1) applying a composition (i) above a substrate;
(2) forming a hydrocarbon-containing film from the composition (i); and
(3) irradiating the hydrocarbon-containing film with plasma, electron beam and/or ion to form a cured film.

The composition (i) comprises a hydrocarbon-containing compound (A) and a solvent (B); and the hydrocarbon-containing compound (A) comprises a structural unit (A1) represented by the formula (A1) to be described later. The hydrocarbon-containing compound (A) only needs to contain the structural unit (A1), and is accepted to contain other structural units. When the hydrocarbon-containing compound (A) contains an other structural unit, and the hydrocarbon-containing compound (A) is polymer, it is one preferred embodiment in which the structural unit (A1) and the other structural unit are copolymerized. In a preferred aspect of the present invention, the hydrocarbon-containing compound (A) essentially consists only of the structural unit (A1). However, terminal modifications are accepted.

Here, the hydrocarbon-containing film is preferably a resist underlayer, more preferably BARC (bottom anti-reflective coating) or SOC, and further preferably SOC. As one embodiment of the present invention, SOC for hard mask and core material SOC are included.

Hydrocarbon-Containing Compound (A)

The hydrocarbon-containing compound (A) according to the present invention comprises a structural unit (A1) represented by the following formula (A1):

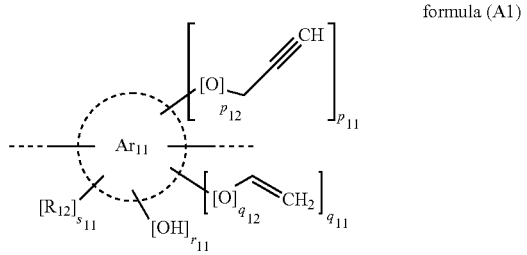

formula (A1)

$Ar_{11}$ is a $C_{6-60}$ hydrocarbon group substituted with $R_{11}$ or unsubstituted, provided that $Ar_{11}$ contains no fused aromatic ring. Preferable $Ar_{11}$ includes 9,9-diphenylfluorene, 9-phenylfluorene, phenyl, a linear $C_{6-60}$ polyphenylene and a branched $C_{6-60}$ polyphenylene, each of which can be independently substituted with $R_{11}$ or unsubstituted.

$R_{11}$ is a linear, branched or cyclic $C_{1-20}$ alkyl, amino or alkylamino. $R_{11}$ is preferably a linear, branched or cyclic $C_{1-10}$ alkyl, or alkylamino. $R_{11}$ is more preferably a linear $C_{1-3}$ alkyl, a branched $C_{1-3}$ alkyl, cyclopentyl, cyclohexyl or dimethylamino.

When the hydrocarbon-containing compound (A) has a plurality of structural units (A1), $R_{11}$ can be interposed between $A_{11}$ and $A_{11}$ and be bonded to each $Ar_{11}$ as a linker. One $Ar_{11}$ can be substituted with one or a plurality of $R_{11}$, and preferably substituted with one $R_{11}$.

In one structural unit (A1), a group enclosed in parentheses (for example, a group enclosed in parentheses accompanied by $p_{11}$) can be bonded to $R_{11}$. In this case, the group and $Ar_{11}$ are bonded via $R_{11}$ as a linker.

Although this is not to intend to limit the present invention and outside the scope of the present invention, such an embodiment that $Ar_{11}$ contains naphthyl (for example, naphthol) is considered to be disadvantageous because it is susceptible to oxidation in the process of the present invention and reconstruction of a cured film by plasma, electron beam and/or ion irradiation is hard to proceed.

$R_{12}$ is I, Br or CN, preferably I or Br, and more preferably I.

$p_{11}$ is a number of 0 to 5. Here, as one embodiment of the present invention, it is possible that the hydrocarbon-containing compound (A) has only each of two types of (A1) as its constituent. An embodiment is possible, in which both $Ar_{11}$ are phenyl, $p_{11}$ relating to one $Ar_{11}$ is 1 and $p_{11}$ relating to the other $Ar_{11}$ is 2. In this case, as a whole $p_{11}$ is 1.5. In the present specification, the same applies to numbers unless otherwise specified.

$p_{11}$ is preferably 0, 1, 2 or 3, more preferably 0, 1 or 2, and further preferably 1. $p_{11}=0$ is also a preferred embodiment of the present invention.

$p_{12}$ is a number of 0 to 1, preferably 0 or 1 and more preferably 1.

$q_{11}$ is a number of 0 to 5, preferably 0, 1, 2 or 3, more preferably 0, 1 or 2, and further preferably 1. $q_{11=0}$ is also a preferred embodiment of the present invention.

$q_{12}$ is a number of 0 to 1, preferably 0 or 1, and more preferably 1.

$r_{11}$ is a number of 0 to 5, preferably 0, 1, 2 or 3, more preferably 0, 1 or 2, and further preferably 1. $r_{11=0}$ is also a preferred embodiment of the present invention.

$s_{11}$ is a number of 0 to 5, preferably 0, 1, 2 or 3, more preferably 0, 1 or 2, and further preferably 1. $s_{11=0}$ is also a preferred embodiment of the present invention.

$p_{11}$, $q_{11}$ and $r_{11}$ do not become 0 simultaneously in one structural unit.

The structural unit (A1) according to the present invention can be more particularly the structural units (A1-1), (A1-2) and/or (A1-3) represented by the following formulae (A1-1), (A1-2) and/or (A1-3). Each is described later.

As one preferred embodiment of the present invention, the structural unit (A1) is the structural unit (A1-1).

The structural unit (A1-1) is represented by the formula (A1-1).

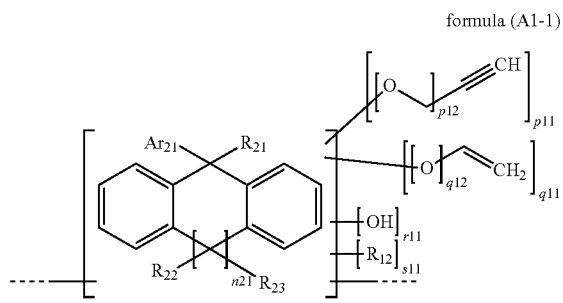

formula (A1-1)

$Ar_{21}$ is a $C_{6-50}$ aromatic hydrocarbon group, and preferably phenyl. Due to $Ar_{21}$ being phenyl, advantageous effects, such that solubility of the hydrocarbon-containing compound (A) in the solvent can be secured and that a thick film can be formed, can be expected.

$R_{21}$, $R_{22}$ and $R_{23}$ are each independently a $C_{6-50}$ aromatic hydrocarbon group, hydrogen or a single bond bonded to another structural unit, preferably phenyl, hydrogen or a single bond bonded to another structural unit, more preferably phenyl or a single bond bonded to another structural unit, and further preferably phenyl.

$n_{21}$ is an integer of 0 or 1, and preferably 0.

$Ar_{21}$, $R_{21}$, $R_{22}$ and $R_{23}$ contain no fused aromatic ring. The definitions and preferred examples of $R_{12}$, $p_{11}$, $p_{12}$, $q_{11}$, $q_{12}$, $r_{11}$ and $s_{11}$ are each independently the same as described above.

Although there is no intention to limit the present invention, exemplified embodiments of the hydrocarbon-containing compound (A) containing the structural unit (A1-1) include the followings.

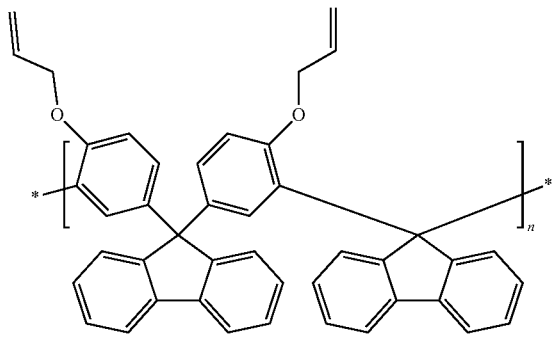

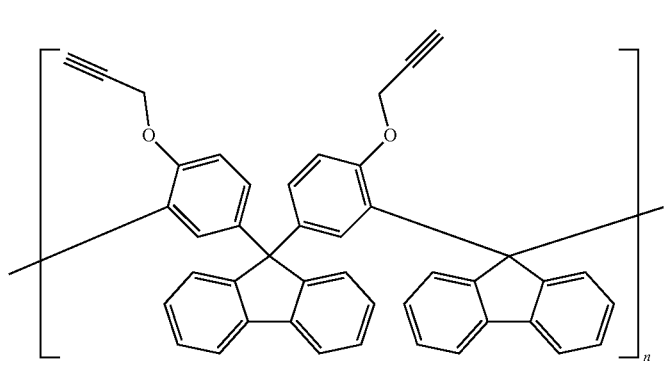

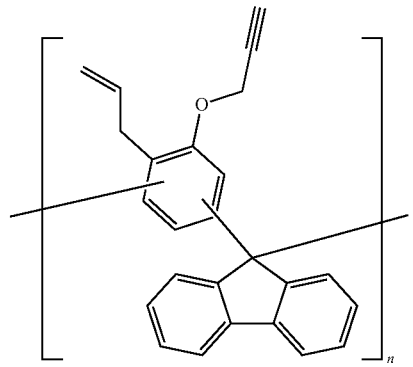

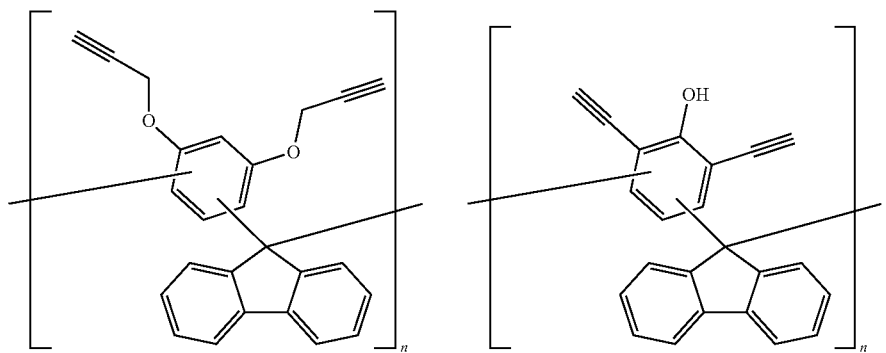

-continued
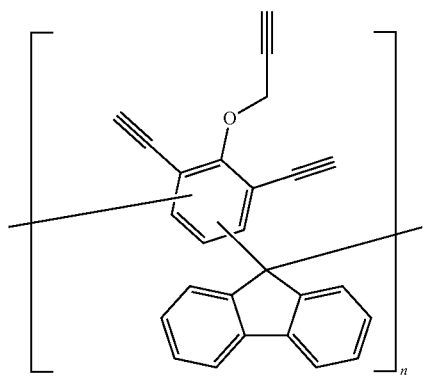 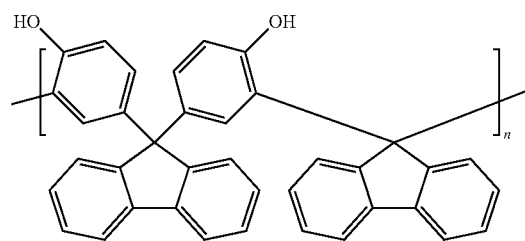
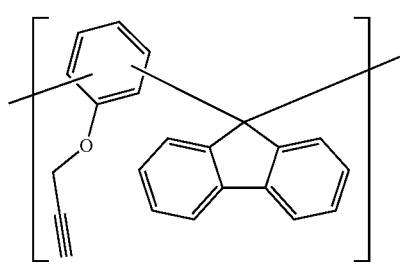 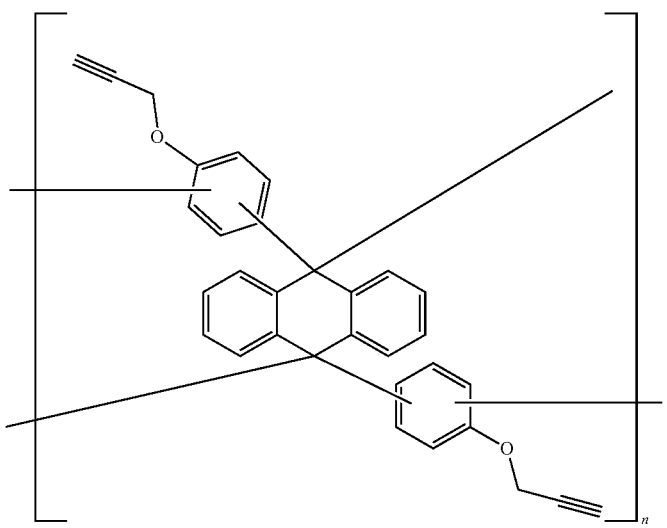
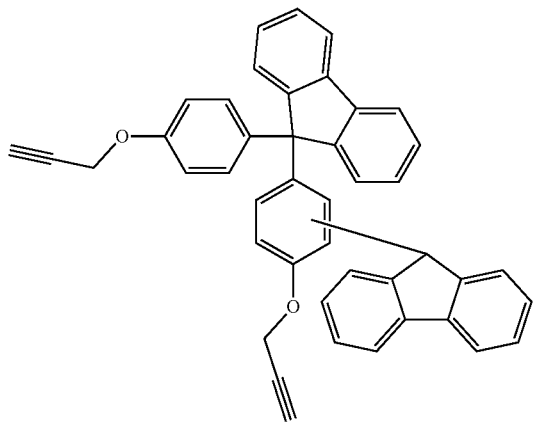 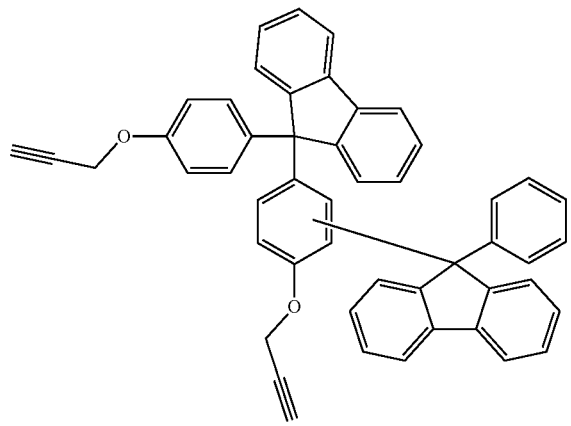

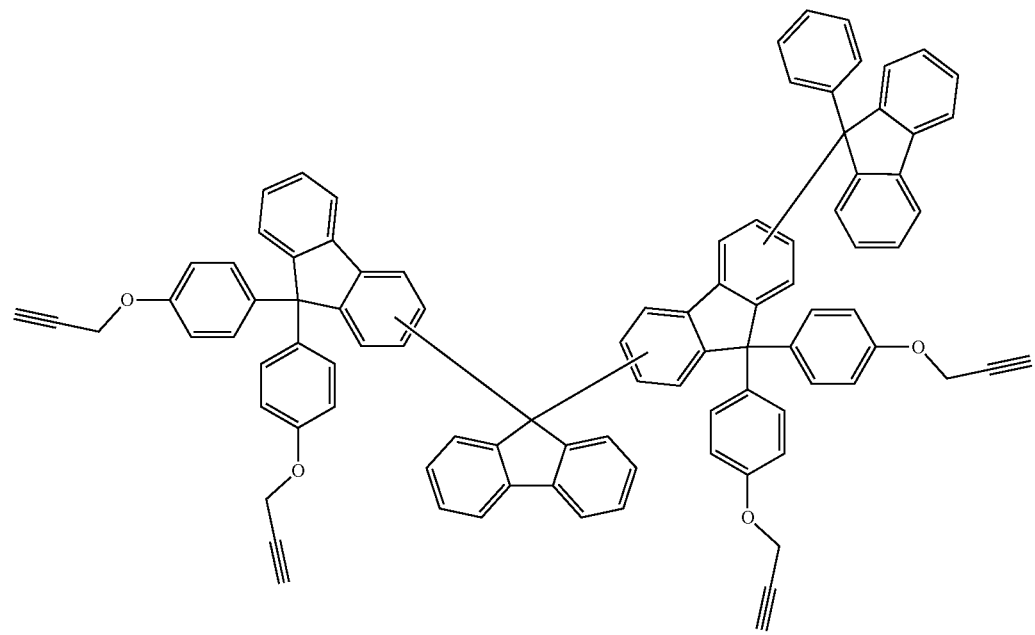
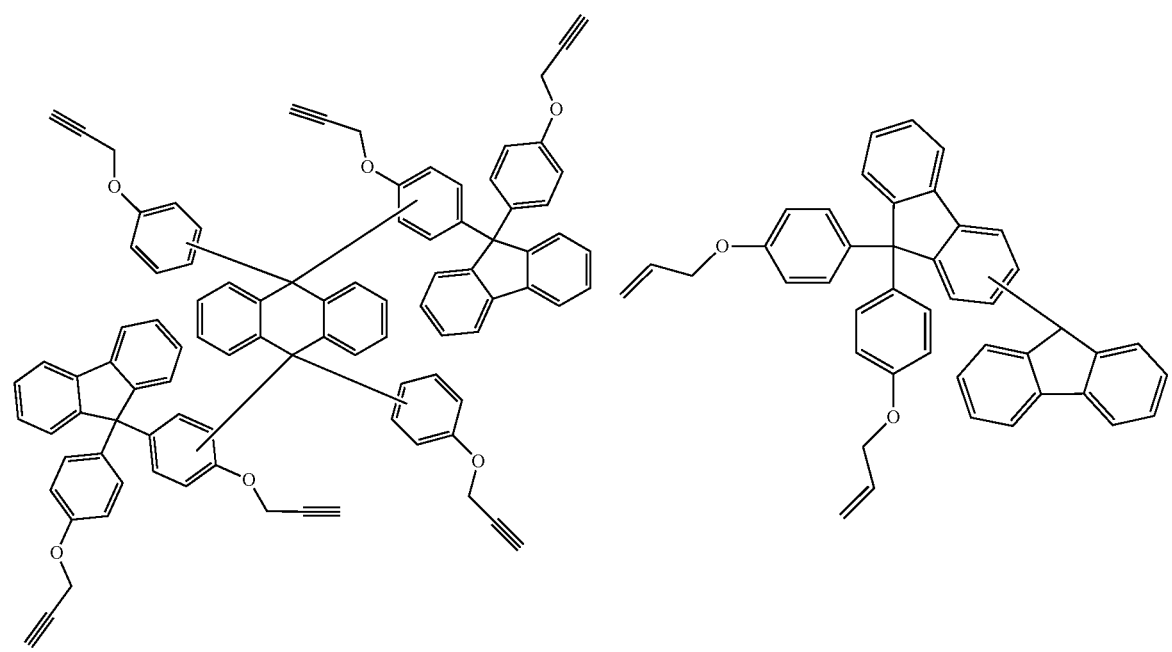

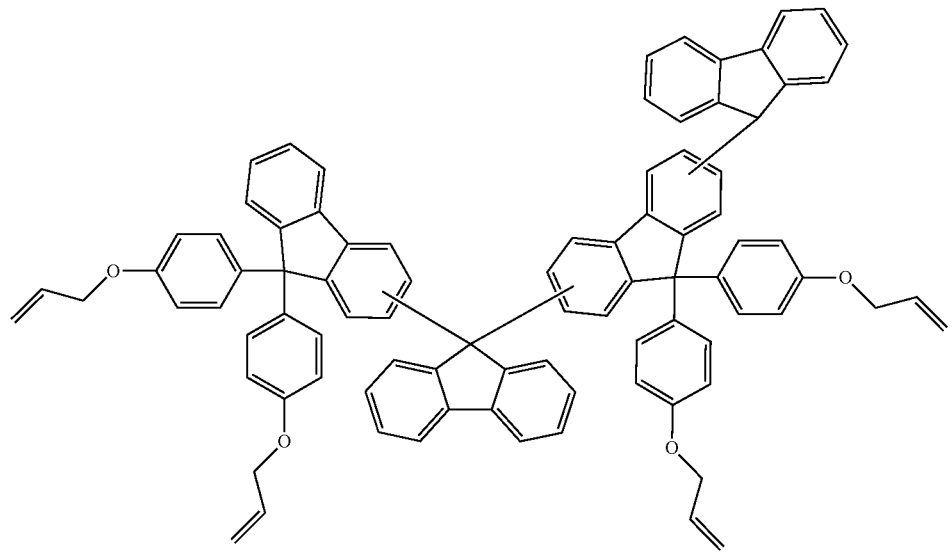

As a further preferred embodiment of the present invention, the structural unit (A1-1) is the structural unit (A1-1-1). The structural unit (A1-1-1) is represented by the formula (A1-1-1).

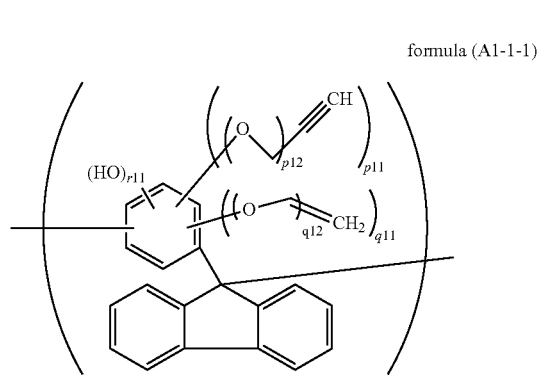

formula (A1-1-1)

The definitions and preferred examples of $p_{11}$, $p_{12}$, $q_{11}$, $q_{12}$, $r_{11}$ and $s_{11}$ are each independently the same as described above. However, $1 \leq p_{11}+q_{11}+r_{11} \leq 4$ is satisfied.

The structural unit (A1-2) is represented by the formula (A1-2).

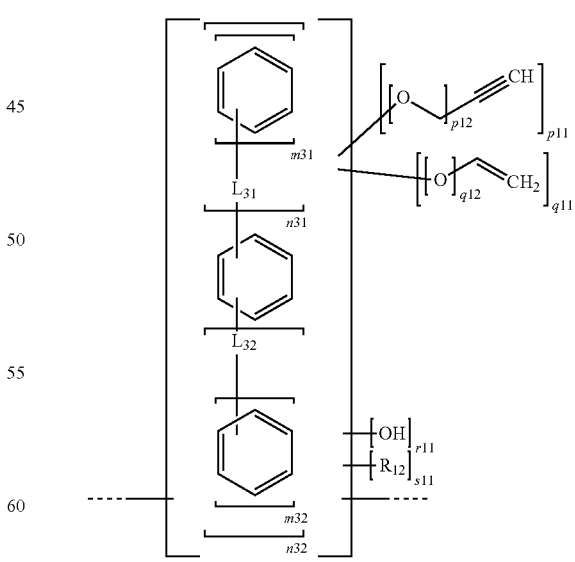

formula (A1-2)

$L_{31}$ and $L_{32}$ are each independently a single bond or phenylene, and preferably a single bond.

$n_{31}$, $n_{32}$, $m_{31}$ and $m_{32}$ are each independently a number of 0 to 6, and preferably an integer from 0 to 3. $n_{31}+n_{32}=5$ or 6 is a preferred embodiment. When $L_{31}$ is a single bond, $m_{31}=1$. When $L_{32}$ is a single bond, $m_{32}=1$.

The definitions and preferred examples of $R_{12}$, $p_{11}$, $p_{12}$, $q_{11}$, $q_{12}$, $r_{11}$ and $s_{11}$ are each independently the same as described above.

Although there is no intention to limit the present invention, exemplified embodiments of the hydrocarbon-containing compound (A) containing the structural unit (A1-2) include the followings.

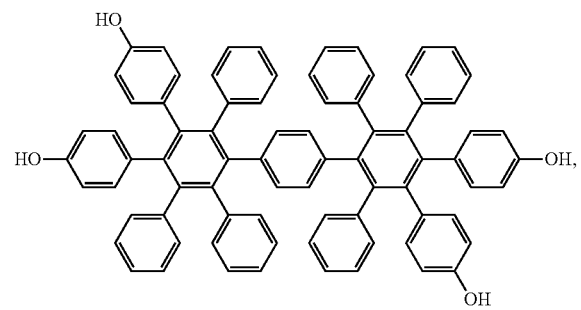

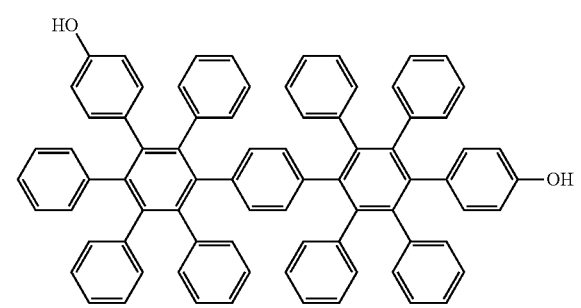

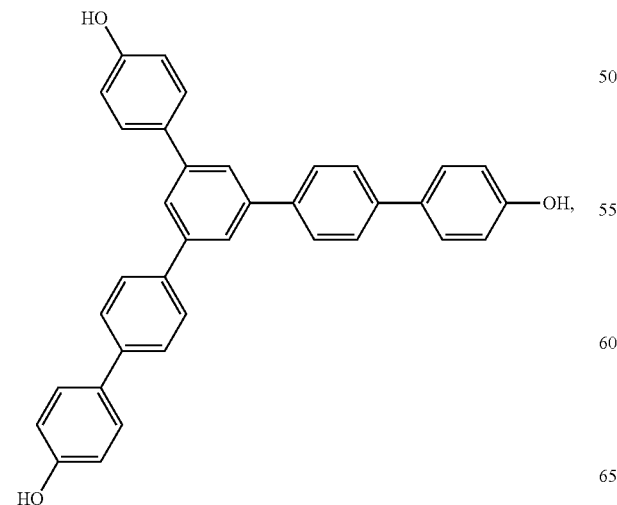

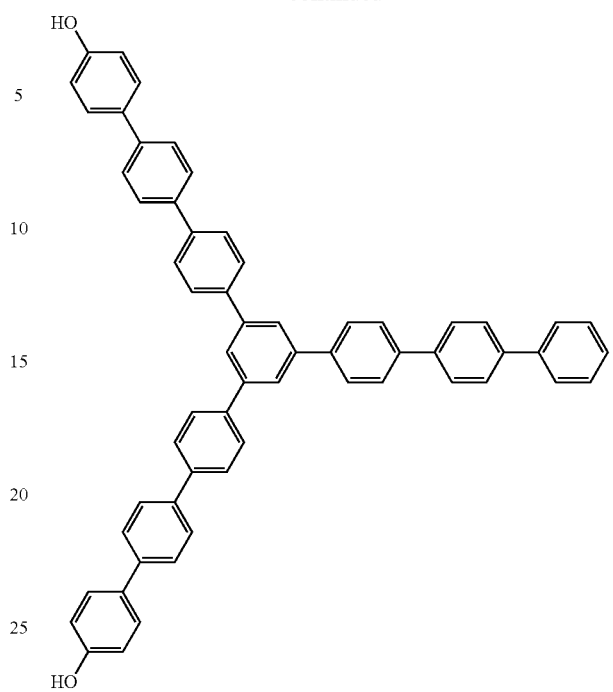

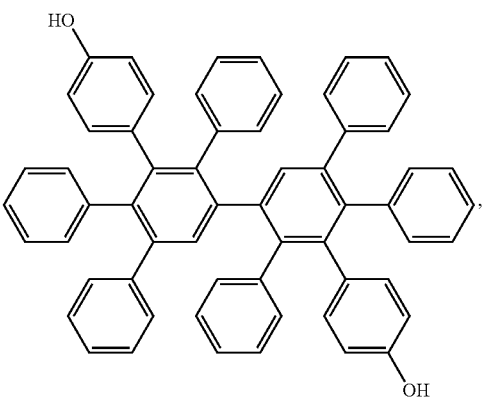

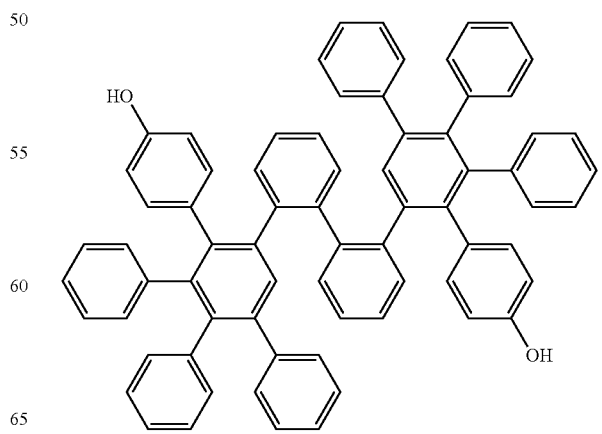

The structural unit (A1-3) is represented by the formula (A1-3).

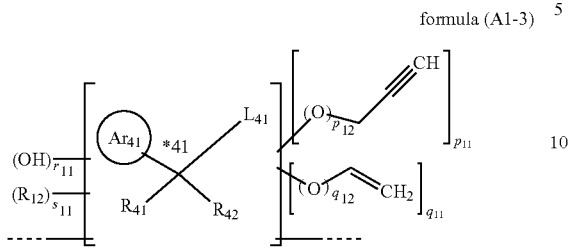

formula (A1-3)

$Ar_{41}$ is a $C_{6-50}$ aromatic hydrocarbon group, and preferably phenyl.

$R_{41}$ and $R_{42}$ are each independently a $C_{1-10}$ alkyl, and preferably a linear $C_{1-6}$ alkyl.

$R_{41}$ and $R_{42}$ can form a hydrocarbon ring, and preferably, they form a saturated hydrocarbon ring.

The carbon atom at the position of *41 is a quaternary carbon atom.

$L_{41}$ is a $C_{6-50}$ arylene or a single bond bonded to another structural unit, preferably phenylene or a single bond bonded to another structural unit, and more preferably a single bond bonded to another structural unit.

The definitions and preferred examples of $R_{12}$, $p_{11}$, $p_{12}$, $q_{11}$, $q_{12}$, $r_{11}$ and $s_{11}$ are each independently the same as described above.

Although there is no intention to limit the present invention, exemplified embodiments of the hydrocarbon-containing compound (A) containing the structural unit (A1-3) include the followings.

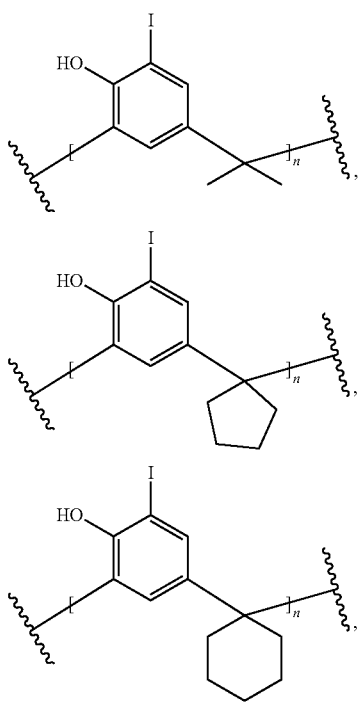

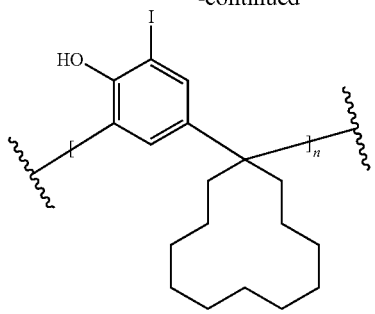

When the hydrocarbon-containing compound (A) according to the present invention is polymer, as one preferred embodiment of the present invention, an aldehyde derivative used when the hydrocarbon-containing compound (A) is synthesized is preferably 0 to 30 mol % (more preferably 0 to 15 mol %, further preferably 0 to 5 mol %, and further more preferably 0 mol %) based on the sum of all elements used in the synthesis. Examples of the aldehyde derivative include formaldehyde.

One preferred embodiment of the present invention is to use a ketone derivative instead of using an aldehyde derivative.

The polymer synthesized in this way can be characterized by having no or few secondary or tertiary carbon atoms in its main chain. As one preferred embodiment of the present invention, the polymer essentially does not contain secondary or tertiary carbon atoms in its main chain. Although not to be bound by theory, by this, improvement of the heat resistance of the formed film can be expected while the polymer is ensuring solubility. However, secondary or tertiary carbon atoms are accepted to be contained in the polymer ends like an end modification.

As one embodiment of the present invention, the molecular weight of the hydrocarbon-containing compound (A) is 500 to 6,000, and more preferably 500 to 4,000. When the hydrocarbon-containing compound (A) is polymer, the weight average molecular weight (Mw) is used as the molecular weight. In the present invention, Mw can be measured by gel permeation chromatography (GPC). In this measurement, it is a preferable example to use a GPC column at 40 degrees Celsius, an elution solvent of tetrahydrofuran at 0.6 mL/min and monodisperse polystyrene as a standard. The same applies to the following.

The content of the hydrocarbon-containing compound (A) is preferably 2 to 30 mass %, more preferably 5 to 30 mass %, further preferably 5 to 25 mass %, and further more preferably 10 to 25 mass %, based on the composition (i).

Solvent (B)

The composition (i) according to the present invention comprises a solvent (B). The solvent (B) is not particularly limited so far as it can dissolve each component blended. The solvent (B) preferably comprises an organic solvent, and more preferably, the organic solvent comprises a hydrocarbon solvent, an ether solvent, an ester solvent, an alcohol solvent, a ketone solvent, or a mixture of any of these.

Exemplified embodiments of the solvent include water, n-pentane, i-pentane, n-hexane, i-hexane, n-heptane, i-heptane, 2,2,4-trimethylpentane, n-octane, i-octane, cyclohexane, methylcyclohexane, benzene, toluene, xylene, ethylbenzene, trimethylbenzene, methylethylbenzene, n-propylbenzene, i-propylbenzene, diethylbenzene, i-butylbenzene, triethylbenzene, di-i-propylbenzene, n-amyl naphthalene, trimethyl benzene, methanol, ethanol, n-propanol, i-propanol, n-butanol, i-butanol, sec-butanol, t-butanol, n-pentanol, i-pentanol, 2-methylbutanol, sec-pentanol, t-pentanol, 3-methoxybutanol, n-hexanol, 2-methylpentanol, sec-hexanol, 2-ethylbutanol, sec-heptanol, heptanol-3, n-octanol, 2-ethylhexanol, sec-octanol, n-nonyl alcohol, 2,6-dimethylheptanol-4, n-decanol, sec-undecyl alcohol, trimethyl nonyl alcohol, sec-tetradecyl alcohol, sec-heptadecyl alcohol, phenol, cyclohexanol, methylcyclohexanol, 3,3,5-trimethylcyclohexanol, benzyl alcohol, phenylmethyl carbinol, diacetone alcohol, cresol, ethylene glycol, propylene glycol, 1,3-butylene glycol, pentanediol-2,4,2-methylpentanediol-2,4, hexanediol-2,5, heptanediol-2,4,2-ethylhexanediol-1,3, diethylene glycol, dipropylene glycol, triethylene glycol, tripropylene glycol, glycerin, acetone, methyl ethyl ketone, methyl n-propyl ketone, methyl n-butyl ketone, diethyl ketone, methyl i-butyl ketone, methyl n-pentyl ketone, ethyl n-butyl ketone, methyl n-hexyl ketone, di-i-butyl ketone, trimethylnonane, cyclohexanone, cyclopentanone, methylcyclohexanone, 2,4-pentanedione, acetonylacetone, diacetone alcohol, acetophenone, fenthion, ethyl ether, i-propyl ether, n-butyl ether (di-n-butyl ether, DBE), n-hexyl ether, 2-ethylhexyl ether, ethylene oxide, 1,2-propylene oxide, dioxolane, 4-methyl dioxolane, dioxane, dimethyl dioxane, ethylene glycol monomethyl ether, ethylene glycol monoethyl ether, ethylene glycol diethyl ether, ethylene glycol mono-n-butyl ether, ethylene glycol mono-n-hexyl ether, ethylene glycol monophenyl ether, ethylene glycol mono-2-ethyl butyl ether, ethylene glycol dibutyl ether, diethylene glycol monomethyl ether, diethylene glycol monoethyl ether, diethylene glycol diethyl ether, diethylene glycol mono-n-butyl ether, diethylene glycol di-n-butyl ether, diethylene glycol mono-n-hexyl ether, ethoxytriglycol, tetraethylene glycol di-n-butyl ether, propylene glycol monomethyl ether (PGME), propylene glycol monoethyl ether, propylene glycol monopropyl ether, propylene glycol monobutyl ether, dipropylene glycol monomethyl ether, dipropylene glycol monoethyl ether, dipropylene glycol monopropyl ether, dipropylene glycol monobutyl ether, tripropylene glycol monomethyl ether, tetrahydrofuran, 2-methyltetrahydrofuran, anisole, diethyl carbonate, methyl acetate, ethyl acetate, γ-butyrolactone, γ-valerolactone, n-propyl acetate, i-propyl acetate, n-butyl acetate (normal butyl acetate, nBA), i-butyl acetate, sec-butyl acetate, n-pentyl acetate, sec-pentyl acetate, 3-methoxybutyl acetate, methylpentyl acetate, 2-ethylbutyl acetate, 2-ethylhexyl acetate, benzyl acetate, cyclohexyl acetate, methyl cyclohexyl acetate, n-nonyl acetate, methyl acetoacetate, ethyl acetoacetate, ethylene glycol monomethyl ether acetate, ethylene glycol monoethyl ether acetate, diethylene glycol monomethyl ether acetate, diethylene glycol monoethyl acetate, diethylene glycol mono-n-butyl ether acetate, propylene glycol monomethyl ether acetate, propylene glycol monoethyl ether acetate, propylene glycol monopropyl ether acetate, propylene glycol monobutyl ether acetate, dipropylene glycol monomethyl ether acetate, dipropylene glycol monoethyl ether acetate, glycol diacetate, methoxytriglycol acetate, ethyl propionate, n-butyl propionate, i-amyl propionate, diethyl oxalate, di-n-butyl oxalate, methyl lactate, ethyl lactate (EL), n-butyl lactate, n-amyl lactate, diethyl malonate, dimethyl phthalate, diethyl phthalate, propylene glycol 1-monomethyl ether 2-acetate (PGMEA), propylene glycol monoethyl ether acetate, propylene glycol monopropyl ether acetate, N-methylformamide, N,N-dimethylformamide, N,N-diethylformamide, acetamide, N-methylacetamide, N,N-dimethylacetamide, N-methylpropionamide, N-methyl pyrrolidone, dimethyl sulfide, diethyl sulfide, thiophene, tetrahydrothiophene, dimethyl sulfoxide, sulfolane, and 1,3-propane sultone. These solvents can be used alone or in any combination of any two or more of these.

It is one preferred embodiment of the present invention that the solvent (B) consists essentially only of those selected from the above exemplified embodyments. However, a solvent for dissolving the surfactant or solid components of the additive is accepted to be contained in the solvent (B) in a small amount.

The solvent (B) is preferably PGMEA, PGME, anisole, EL, nBA, DBE or a mixture of any of these, more preferably PGMEA, PGME or a mixture of any of these, and further preferably PGMEA. When the two types are mixed, the mass ratio of the first solvent: the second solvent is preferably 95:5 to 5:95 (more preferably 90:10 to 10:90, and further preferably 80:20 to 20:80).

In relation to other layers or films, it is also one embodiment that the solvent (B) substantially contains no water. For example, the amount of water in the total solvent (B) is preferably 0.1 mass % or less, more preferably 0.01 mass % or less, and further preferably 0.001 mass % or less. It is also a preferable embodiment that the solvent (B) contains no water (0 mass %).

The content of the solvent (B) is preferably 60 to 98 mass %, more preferably 60 to 95 mass %, further preferably 70 to 95 mass %, and further more preferably 70 to 90 mass %, based on the composition (i).

Surfactant (C)

The composition (i) according to the present invention can further comprise a surfactant (C).

Due to the surfactant being included, coating properties can be improved.

In the present invention, the surfactant (C) means a compound having the above function itself. The compound is sometimes dissolved or dispersed in a solvent and contained in the composition, but such a solvent is preferably contained in the composition as the solvent (B) or another component. Hereinafter, the same applies to various additives that can be included in the composition.

The surfactant that can be used in the present invention includes (I) an anionic surfactant, (II) a cationic surfactant or (III) a nonionic surfactant, and more particularly, (I) alkyl sulfonate, alkylbenzene sulfonic acid and alkylbenzene sulfonate, (II) lauryl pyridinium chloride and lauryl methyl ammonium chloride, and (III) polyoxyethylene octyl ether, polyoxyethylene lauryl ether and polyoxy ethylene acetylenic glycol ether, and fluorine-containing surfactants, such as Fluorad (3M), Megafac (DIC), Surflon (AGC)), or organosiloxane surfactants (for example, KP341 (Shin-Etsu Chemical)) are preferred.

The content of the surfactant (C) is preferably 0.01 to mass %, more preferably 0.05 to 10 mass %, further preferably 0.05 to 5 mass %, and further more preferably 0.05 to 1 mass %, based on the hydrocarbon-containing compound (A).

Additive (D)

The composition (i) according to the present invention can further comprise an additive (D). The additive (D) is a component different from (A), (B) and (C). Preferably, the additive (D) comprises a crosslinking agent, a high carbon material, an acid generator, a radical generator, a photopolymerization initiator, a substrate adhesion enhancer, or a mixture of any of these. More preferably, the additive (D) comprises a crosslinking agent, an acid generator, a radical generator, a photopolymerization initiator, a substrate adhesion enhancer, or a mixture of any of these. As a more preferred additive (D), a crosslinking agent is included. As another embodiment of the present invention, a high carbon material is included as the additive (D).

The crosslinking agent is useful for such purposes to increase film formability when forming the hydrocarbon-containing film according to the present invention, to prevent the film from being intermixed with a upper layer film (for example, a silicon-containing interlayer and a resist) to be formed on its upper layer, and to eliminate diffusion of low molecular components into the upper layer film.

As the crosslinking agent, melamine compounds, guanamine compounds, glycoluril compounds or urea compounds substituted with at least one group selected from a methylol group, an alkoxymethyl group, and an acyloxymethyl group; epoxy compounds; thioepoxy compounds; isocyanate compounds; azide compounds; and compounds comprising a double bond such as an alkenyl ether group can be included. These can be used as additives or can be introduced into the side chains of the polymer as pendant groups. Further, compounds comprising a hydroxy group can also be used as the crosslinking agent.

Among the above various compounds, as examples of the epoxy compounds, tris(2,3-epoxypropyl)-isocyanurate, trimethylolmethane triglycidyl ether, trimethylolpropane triglycidyl ether, triethylolethane triglycidyl ether, and the like can be included. Exemplified embodiments of the melamine compounds include hexamethylolmelamine, hexamethoxymethyl-melamine, compounds derived by methoxymethylation of 1 to 6 methylol groups of hexamethylolmelamine and mixtures thereof, hexamethoxyethyl-melamine, hexaacyloxymethylmelamine, compounds derived by acyloxymethylation of 1 to 6 methylol groups of hexamethylolmelamine or mixtures thereof. As the guanamine compounds, tetramethylolguanamine, tetramethoxymethylguanamine, compounds derived by methoxymethylation of 1 to 4 methylol groups of tetramethylolguanamine and mixtures thereof, tetramethoxyethylguanamine, tetraacyloxyguanamine, compounds derived by acyloxymethylation of 1 to 4 methylol groups of tetramethylolguanamine and mixtures thereof can be included. As the glycoluril compounds, tetramethylolglycoluril, tetramethoxyglycoluril, tetramethoxymethylglycoluril, compounds derived by methoxymethylation of 1 to 4 methylol groups of tetramethylolglycoluril or mixtures thereof, compounds derived by acyloxymethylation of 1 to 4 methylol groups of tetramethylolglycoluril or mixtures thereof can be included. As the urea compounds, tetramethylolurea, tetramethoxymethylurea, compounds derived by methoxymethylation of 1 to 4 of methylol groups of tetramethylolurea or mixtures thereof, tetramethoxyethylurea, and the like can be included.

As the compounds containing an alkenyl ether group, ethylene glycol divinyl ether, triethylene glycol divinyl ether, 1,2-propanediol divinyl ether, 1,4-butanediol divinyl ether, tetramethylene glycol divinyl ether, neopentyl glycol divinyl ether, trimethylolpropane trivinyl ether, hexanediol divinyl ether, 1,4-cyclohexanediol divinyl ether, pentaerythritol trivinyl ether, pentaerythritol tetravinyl ether, sorbitol tetravinyl ether, sorbitol pentavinyl ether, trimethylolpropane trivinyl ether, and the like can be included.

The molecular weight of the crosslinking agent is preferably 100 to 480, more preferably 200 to 400, and further preferably 300 to 380.

Although there is no intention to limit the present invention, exemplified embodiments of the crosslinking agent include the followings.

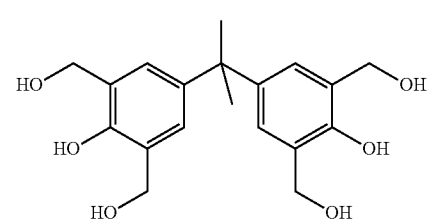

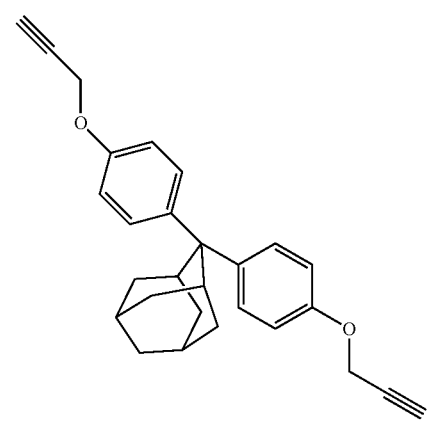

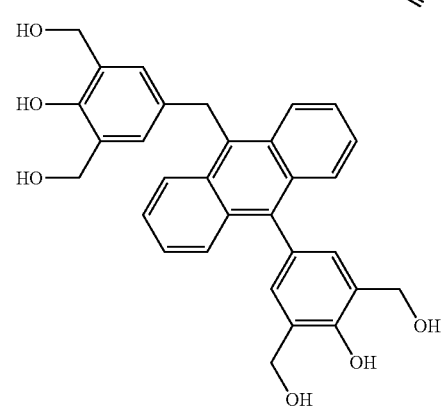

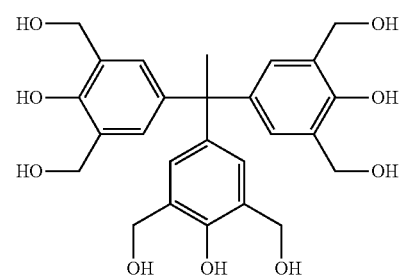

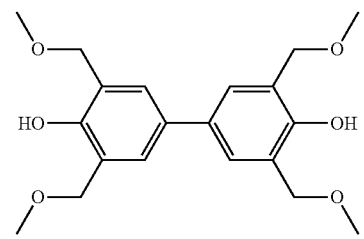

-continued

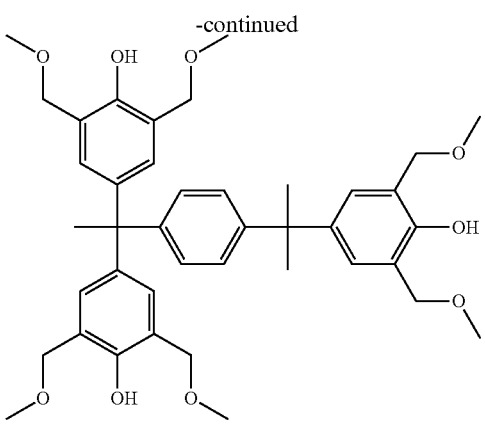

The high carbon material is a molecule containing a large number of carbon atoms per molecule, and is a solid component that remains in the hydrocarbon-containing film according to the present invention. By adding the high carbon material, it is possible to improve etching resistance. It is not necessary that the high carbon 10 material itself can be formed to be a film, and it is sufficient if a hydrocarbon-containing film can be formed together with the hydrocarbon-containing compound (A).

Although there is no intention to limit the present invention, exemplified embodiments of the high carbon material include isobiolantrone, 2,7-di(1-pyrenyl)-9,9'-spirobi[9H-fluorene], 9,9-bis[4-[di(2-naphthyl)amino]-phenyl]fluorene, 9,9-bis[4-[N-(1-naphthyl) anilino]-phenyl]fluorene, 3,4,9,10-perylenetetracarboxylic acid dianhydride, 3,4,9,10-perylenetetracarboxylic diimide, benzanthrone, perylene, coronene, 5,12-naphthacene-quinone, 6,13-pentacenedione, fullerene $C_{60}$, $C_{60}MC_{12}$ ($C_{60}$ fused N-methylpyrrolidine-m-$C_{12}$-phenyl), ICBA (indene-$C_{60}$ bisadduct), N,2-diphenyl [60] fullero-pyrrolidine, PCBM (Phenyl-$C_{61}$-Butyric-Acid-Methyl Ester), PCBB (Phenyl-$C_{61}$-Butyric-Acid-Butyl Ester), N-phenyl-2-hexyl[60] fulleropyrrolidine, and the like.

In the present invention, the content of the additive (D) is preferably 0.05 to 100 mass %, more preferably 0.05 to 25 mass %, further preferably 0.05 to 20 mass %, further more preferably 0.05 to 15 mass %, and further more preferably 0.05 to 10 mass %, based on the hydrocarbon-containing compound (A).

Method for Manufacturing a Cured Film

The method for manufacturing a cured film according to the present invention comprises the following processes: (1) applying a composition (i) above a substrate; (2) forming a hydrocarbon-containing film from the composition (i); and (3) irradiating the hydrocarbon-containing film with plasma, electron beam and/or ion to form a cured film.

In the present invention, the method for applying the composition (i) includes a coating method such as a spinner or a coater. The composition (i) according to the present invention is advantageous for embedding in a pattern being above a substrate. The "above a substrate" is preferably that the composition (i) is in direct contact with a substrate, but it can be applied via another film.

The method for forming a hydrocarbon-containing film from the composition (i) includes ultraviolet irradiation and/or heating, and preferably heating.

Preferably, the conditions of ultraviolet irradiation are to irradiate ultraviolet light having the wavelength of 10 to 380 nm (more preferably 10 to 200 nm) with an integrated irradiation amount of 100 to 10,000 $mJ/cm^2$.

As the atmosphere for ultraviolet irradiation and heating, air is preferable. In order to prevent oxidation of the present composition (i) and/or the hydrocarbon-containing film of the present invention, it is also possible to reduce the oxygen concentration. For example, the oxygen concentration can be reduced to 1,000 ppm or less (preferably 100 ppm or less) by injecting an inert gas ($N_2$, Ar, He or a mixture of any of these) into the atmosphere.

When the hydrocarbon-containing film is formed by heating, the heating conditions are appropriately selected from the ranges, which are a heating temperature of 80 to 800° C. (preferably 200 to 700° C., and more preferably 300 to 600° C.) and a heating time of 30 to 180 seconds (preferably 30 to 120 seconds). Although not to be bound by theory, it is considered that by performing high-temperature heating, crosslinking by a group that makes polymer crosslinked with each other, such as an ethynyl group, can be favorably promoted, and this can contribute to densification of a cured film.

It is also possible to perform the heating by dividing it into several steps (step bake). The hydrocarbon-containing film can also be formed only by heating, but a combination with ultraviolet irradiation is also preferable.

Plasma, electron beam and/or ion are irradiated to the hydrocarbon-containing film to form a cured film. Although not to be bound by theory, it is considered that by these irradiation, the chemical bonds of the hydrocarbon-containing film are made dissociated and recombined to be reconstructed as a cured film having a diamond-like carbon structure, thereby contributing to the increase in hardness and density.

As one embodiment of the present invention, forming a cured film by performing irradiation with plasma, electron beam and/or ion immediately after applying the composition (i) is also included. That is, an embodiment in which the above processes (2) and (3) proceed almost simultaneously in one operation (process) is also included in the present invention.

Known methods can be used for the plasma irradiation. For example, methods described in JP-B 5746670 (patent document), and "Improvement of the wiggling profile of spin-on carbon hard mask by $H_2$ plasma treatment" (J. Vac. Sci. Technol. B 26 (1), January/February 2008, pp. 67-71; non-patent document) are included.

The RF discharge power can be selected from 1,000 to 10,000 W, and more preferably 1,000 to 5,000 W.

As examples of the gas atmosphere, $N_2$, NF3, $H_2$, fluorocarbon and rare gas, and preferably Ar, Ne, NF3, $H_2$, $CF_4$, $CHF_3$, $CH_2F_2$, $CH_3F$, $C_4F_6$ and $C_4F_8$ can be included. These gases can be used as a mixture of any two or more of these. It is an advantage of the present invention that the effects of the present invention can be expected even when a gas atmosphere containing no $O_2$ is used.

The time can be selected from 10 to 240 seconds. The pressure can be appropriately selected.

Known methods can be used for the electron beam irradiation. For example, a method described in "Technique of electron beam irradiation apparatus and its use" (July 2012, SEI Technical Review, No. 181, pp. 50-57; non-patent document) is included.

The acceleration voltage can be selected from 2 to 200 kV.

The irradiation amount can be selected from 100 to 5,000 kGy.

An embodiment in which the electron beam irradiation is performed while heating is preferable. At this time, the temperature can be selected from 80 to 800° C. (preferably 200 to 700° C., and more preferably 300 to 600° C.).

Known methods can be used for the ion irradiation. For example, a method described in "Raman spectroscopy and microhardness of ion-implanted a-C: H-films" (Ceramics Int. 26 (1), 2000, pp. 29-32; non-patent document) is included. One preferred embodiment of the ion irradiation of the present invention is ion implantation.

As the elemental species of the ion to be irradiated, hydrogen, boron, carbon, nitrogen and rare gas, preferably boron, carbon, nitrogen, neon, argon etc., and more preferably carbon and nitrogen etc. can be included. These gases can be used as a mixture of any two or more of these.

The acceleration voltage can be selected from 3 to 1000 kV. The acceleration voltage is more preferably 5 to 750 kV, and further preferably 10 to 500 kV.

The irradiation amount can be selected from $10^{13}$ to $10^{18}$ ion/cm$^2$. The irradiation amount is more preferably $5 \times 10^{13}$ to $5 \times 10^{17}$ ion/cm$^2$, and further preferably $10^{14}$ to $10^{17}$ ion/cm$^2$.

The ion irradiation can also be performed while heating the inside of the apparatus chamber. At this time, the temperature can be selected from 500° C. or lower. When heating after the plasma irradiation and electron beam irradiation, the heating conditions are appropriately selected from the ranges, which are a heating temperature of 80 to 800° C. (preferably 200 to 700° C., and more preferably 300 to 600° C.) and a heating time of 30 to 180 seconds (preferably 30 to 120 seconds). Although not to be bound by theory, it is considered that by performing high-temperature heating after the plasma and electron beam irradiation, the dangling bonds are made bonded, and this can contribute to the densification of the cured film.

Tactras Vigus, EB-ENGINE (Hamamatsu Photonics) and EXCEED2300AH (Nissin Ion Equipment) can be used as the irradiation equipment. It is possible to select an equipment and set conditions so as to exhibit the effects of the present invention.

In one embodiment of the present invention, it is possible that the cured film formed in the process (3) has an advantageous effect that the film density is increased by 5 to 75% and/or the film hardness is increased by 50 to 500%, as compared with the hydrocarbon-containing film formed in the process (2).

Further, it is possible that the intensity ratio of G band and D band R=$I_D/I_G$ in Raman spectroscopy (measured with laser wavelength of 514.5 nm) of the cured film formed in the process (3) is 0.35 to 0.90, and although not to be bound by theory, it is considered possible to have a diamond-like carbon structure.

Further, it is considered that the hydrocarbon-containing film formed in the process (2) is more easily etched by 5 to 200% (preferably 5 to 100%, more preferably 5 to 50%, and further preferably 10 to 50%) than the cured film formed in the process (3) (the latter cured film has higher etching resistance).

Preferably, the surface resistivity of the cured film formed in the process (3) is $10^9$ to $10^{16}$ Ω/sq (more preferably $10^{12}$ to $10^{16}$ Ω/sq, and further preferably $10^{13}$ to $10^{16}$ Ω/sq). That is, the hydrocarbon-containing compound (A) is not a conductive polymer precursor, and the cured film according to the present invention is not a conductive polymer film.

As one embodiment of the present invention, a carbon-containing cured film having the following characteristics is provided:

the film density is 1.3 to 3.2 g/cm$^3$;
the film hardness is 1.5 to 20 GPa; and/or intensity ratio of G band and D band R=$I_D/I_G$ in Raman spectroscopy (measured with laser wavelength of 514.5 nm) is 0.35 to 0.90.

Preferably, the carbon-containing cured film is formed by irradiating plasma, electron beam and/or ion. More preferably, the surface resistivity of the film is $10^9$ to $10^{16}$ Ω/sq (Ohm square). It is a more preferable embodiment of the present invention to use the composition (i) as the composition for forming such a carbon-containing cured film.

With respect to a film known as SOC, there is a description in "The Role of Underlayers in EUVL" (Journal of Photopolymer Science and Technology, Vol. 31, Number 2, pp. 209-214, 2018), but the film density disclosed therein was only about 1.05 to 1.32 g/cm$^3$.

The cured film or the carbon-containing cured film according to the present invention preferably has the film density of 1.3 to 3.2 g/cm$^3$ (more preferably 1.4 to 3.2 g/cm$^3$, and further preferably 1.5 to 2.8 g/cm$^3$). It is considered that the high film density of the cured film contributes to the increase in etching resistance. Further, it is considered that too strong stress of the cured film causes application of stress to the substrate and that this is disadvantageous.

For the measurement of the film density, for example, the methods described in Examples can be used, and it can be adjusted by appropriately combining them with known methods.

The film according to the present invention preferably has the film hardness of 1.5 to 20 GPa (more preferably 1.7 to 20 GPa, further preferably 2.0 to 15 GPa, and further more preferably 2.0 to 10 GPa).

The film hardness can be measured, for example, by the methods described in Examples, and it can be adjusted by appropriately combining them with known methods.

The film according to the present invention preferably has intensity ratio of G band and D band R=$I_D/I_G$ in Raman spectroscopy (measured with laser wavelength of 514.5 nm) is 0.35 to 0.90 (more preferably 0.40 to 0.90, further preferably 0.40 to 0.80, and further more preferably 0.45 to 0.70).

For Raman spectroscopy, for example, the methods described in Examples can be used, and it can be adjusted by appropriately combining them with known methods (for example, JP-B 3914179 (patent document)).

<Methods for Manufacturing a Resist Film and a Resist Pattern>

It is also possible to manufacture a resist film above the cured film manufactured by the method according to the present invention.

The method for manufacturing a resist film according to the present invention comprises:
(4) applying a resist composition above the cured film; and
(5) heating the resist composition to form a resist layer.

Further, in the present invention, a resist pattern can be manufactured from the resist film. The method for manufacturing a resist pattern according to the present invention comprises:
(6) exposing the resist layer;
optionally, (7) subjecting the resist layer to the post exposure bake; and
(8) developing the resist layer.

Comprising.

Although describing for clarity, the numbers in parentheses mean the order. For example, the process (4) is performed before the process (5).

Hereinafter, one embodiment of the methods for manufacturing a resist film and a resist pattern according to the present invention is described.

A resist composition is applied above a substrate (for example, a silicon/silicon dioxide-coated substrate, a silicon nitride substrate, a silicon wafer substrate, a glass substrate, an ITO substrate, etc.) by an appropriate method. Here, in the present invention, the "above" includes the case where a layer is formed in contact with and above a substrate and the case where a layer is formed above a substrate with another layer in contact with the layer. For example, a planarization film or a resist underlayer can be formed in contact with and above a substrate, and the resist composition can be applied in contact with and above it. The application method is not particularly limited, and examples thereof include a method using a spinner or a coater. After application, a resist layer is formed by heating. The heating of (5) is performed, for example, by a hot plate. The heating temperature is preferably 60 to 140° C., and more preferably 90 to 110° C. The temperature here is a temperature of heating atmosphere, for example, that of a heating surface of a hot plate. The heating time is preferably 30 to 900 seconds, and more preferably 60 to 300 seconds. The heating is performed preferably in the air or nitrogen gas atmosphere.

The thickness of the resist layer is selected according to the purpose. It is also possible to make the thickness of the resist layer to be thicker than 1 μm.

The exposure is performed to the resist layer through a predetermined mask. The wavelength of the light to be used for exposure is not particularly limited, but it is preferable to expose with light having the wavelength of 190 to 440 nm (more preferably 240 to 370 nm). In particular, KrF excimer laser (wavelength: 248 nm), ArF excimer laser (wavelength: 193 nm), i-line (wavelength: 365 nm), h-line (wavelength: 405 nm), g-line (436 nm), and the like can be used. The wavelength is more preferably 240 to 440 nm, further preferably 360 to 440 nm, and further preferably 365 nm. As to the wavelength, range of ±1% is accepted.

After exposure, post exposure bake (hereinafter sometimes referred to as PEB) can be optionally performed. The heating of (7) is performed, for example, by a hot plate. The post exposure baking temperature is preferably 80 to 160° C., more preferably from 105 to 115° C., and the heating time is 30 to 600 seconds, preferably 60 to 200 seconds. The heating is preferably performed in the air or nitrogen gas atmosphere.

After the PEB, the development is performed using a developer. As the developing method, methods used for developing a photoresist, such as a paddle developing method, an immersion developing method, or a swinging immersion developing method, can be used. Further, as the developer, aqueous solution containing inorganic alkalis, such as sodium hydroxide, potassium hydroxide, sodium carbonate and sodium silicate; organic amines, such as ammonia, ethylamine, propylamine, diethylamine, diethylaminoethanol and triethylamine; quaternary amines, such as tetramethylammonium hydroxide (TMAH); and the like, are used, and a 2.38 mass % TMAH aqueous solution is preferred. A surfactant can be further added to the developer. The temperature of the developer is preferably to 50° C., more preferably 25 to 40° C., and the development time is preferably 10 to 300 seconds, more preferably 30 to 60 seconds. After the development, washing or rinsing can also be performed as necessary.

As one embodiment of the present invention, various substrates that serve as an underlying material can also be patterned using the formed resist pattern as a mask. The substrate can be directly processed using the resist pattern as a mask, or can be processed via an interlayer. For example, a resist underlayer can be patterned using the resist pattern as a mask and the substrate can be patterned using the resist underlayer pattern as a mask. Known methods can be used for processing, and a dry etching method, a wet etching method, an ion implantation method, a metal plating method and the like, can be used. It is also possible to wire electrodes and the like on the patterned substrate.

Substrate

In the present invention, the substrate includes a semiconductor wafer, a glass substrate for a liquid crystal display device, a glass substrate for an organic EL display device, a glass substrate for a plasma display, a substrate for an optical disk, a substrate for a magnetic disk, a substrate for a magneto-optical disk, a glass substrate for a photomask, and a substrate for a solar cell. The substrate can be either a non-processed substrate (for example, a bare wafer) or a processed substrate (for example, a pattern substrate). The substrate can be configured by laminating a plurality of layers. Preferably, the surface of the substrate is a semiconductor. The semiconductor can be composed either of an oxide, a nitride, a metal or a combination of any of these. Further, the surface of the substrate is preferably selected from the group consisting of Si, Ge, SiGe, $Si_3N_4$, TaN, $SiO_2$, $TiO_2$, $Al_2O_3$, SiON, $HfO_2$, $T_2O_5$, $HfSiO_4$, $Y_2O_3$, GaN, TIN, TaN, $Si_3N_4$, NbN, Cu, Ta, W, Hf, and Al.

Device

A device can be manufactured by further processing the substrate according to the present invention. As the device, a semiconductor device, a liquid crystal display device, an organic EL display device, a plasma display device, and a solar cell device are included. The device is preferably the semiconductor. Known methods can be used for these processing. After forming a device, if necessary, the substrate can be cut into chips, connected to a lead frame, and packaged with resin. An example of the packaged one is the semiconductor.

The present invention is described below with reference to various examples. The embodiment of the present invention is not limited to these examples.

<Synthesis of P0>

A reactor equipped with a stirrer, a Liebig condenser, a heater, a nitrogen inlet tube and a temperature controller is prepared. 9-Fluorenone (200 parts, Tokyo Chemical Industry), 9,9-bis(4-hydroxy-phenyl) fluorene (2,333 parts, Osaka Gas Chemicals) and dichloromethane (10,430 parts) are added into the reactor, and the mixture is maintained at 40° C. while stirring under nitrogen atmosphere. Thereafter, trifluoromethanesulfonic acid (92 parts, Mitsubishi Materials Electronic Chemicals) and 3-mercaptopropionic acid (6 parts, Tokyo Chemical Industry) dissolved in dichloromethane (200 parts) are slowly added into the reactor, and the mixture is maintained at 40° C. and stirred to react for 4 hours. After completion of the reaction, the solution is returned to room temperature, water is added to the reaction solution, and excess 9,9-bis(4-hydroxyphenyl) fluorene is removed by filtration and washed with dichloromethane. The dichloromethane solution is thoroughly washed with water to remove trifluoromethanesulfonic acid. Thereafter, dichloromethane is evaporated at 40° C. and 10 mmHg to obtain P0 (2,111 parts). Measurement of the molecular weight by GPC (tetrahydrofuran) gives the number average molecular weight: Mn=533 Da, the weight average molecular weight: Mw=674 Da, and the molecular weight distribution: (Mw/Mn)=1.26.

Synthesis Example 1: Synthesis of P1

A reactor equipped with a stirrer, a Liebig condenser, a heater, a nitrogen inlet tube and a temperature controller is prepared. P0 (350 parts), potassium carbonate (562 parts) and acetone (1,414 parts) are added to the reactor, and the mixture is maintained at 56° C. while stirring under nitrogen atmosphere. Thereafter, allyl bromide (500 parts, Tokyo Chemical Industry) is slowly added into the reactor, and the mixture is maintained at 56° C. and stirred to react for 3 hours. After completion of the reaction, the solution is returned to room temperature, excess potassium carbonate and salts are removed by filtration, and the precipitate is washed with acetone. Thereafter, acetone is evaporated at 40° C. and 10 mmHg. The obtained solid is dissolved in ethyl acetate (3,000 parts), and the ethyl acetate solution is thoroughly washed with water to remove metal impurities. After ethyl acetate is evaporated at 40° C. and 10 mmHg, the obtained solid content is dissolved in acetone (600 parts). Thereafter, the acetone solution is put into n-heptane (6000 parts), the solid is filtered and dried under the conditions of 100° C. and 10 mmHg to obtain P1 (345 parts). Measurement of the molecular weight by GPC (tetrahydrofuran) gives the number average molecular weight: Mn=671 Da, the weight average molecular weight: Mw=833 Da, and the molecular weight distribution: (Mw/Mn)=1.32.

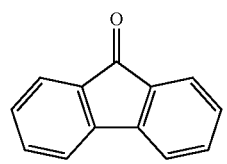

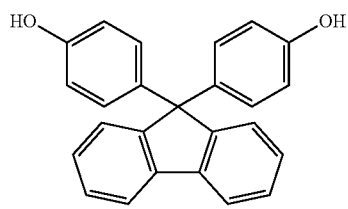

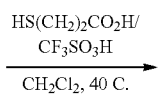

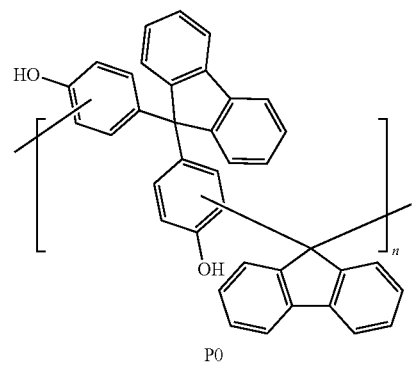

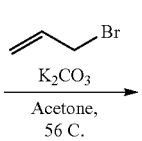

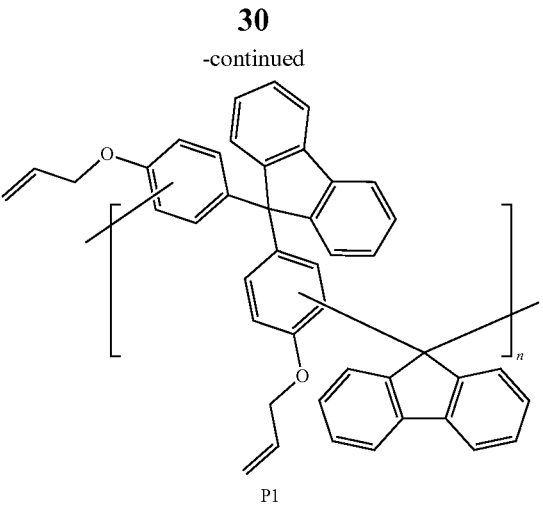

P1

Synthesis Example 2: Synthesis of P2

A reactor equipped with a stirrer, a Liebig condenser, a heater, a nitrogen inlet tube and a temperature controller is prepared. P0 (200 parts), potassium carbonate (323 parts) and acetone (616 parts) are added to the reactor, and the mixture is maintained at 56° C. while stirring under nitrogen atmosphere. Thereafter, 3-bromo-1-propyne (278 parts) is slowly added into the reactor, and the mixture is maintained at 56° C. and stirred to react for 3 hours. After completion of the reaction, the solution is returned to room temperature, excess potassium carbonate and salts are removed by filtration, and the precipitate is washed with acetone. Thereafter, acetone is evaporated at 40° C. and 10 mmHg. The obtained solid is dissolved in ethyl acetate (820 parts), and the ethyl acetate solution is thoroughly washed with water to remove metal impurities. After ethyl acetate is evaporated at 40° C. and 10 mmHg, the obtained solid content (185 parts) is dissolved in acetone (185 parts). Thereafter, methanol (1,850 parts) is put into the acetone solution, the solid is filtered and dried under the conditions of 100° C. and 10 mmHg to obtain P2 (76 parts). Measurement of the molecular weight by GPC (tetrahydrofuran) gives the number average molecular weight: Mn=789 Da, the weight average molecular weight: Mw=1,054 Da, and the molecular weight distribution: (Mw/Mn)=1.34.

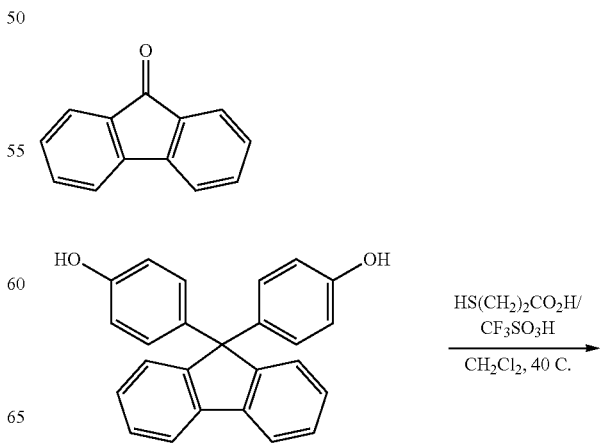

-continued

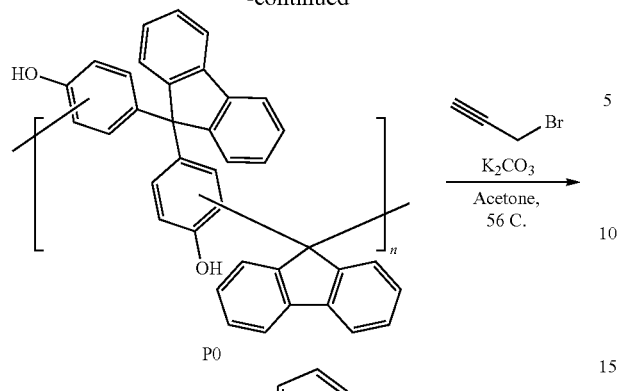

P0

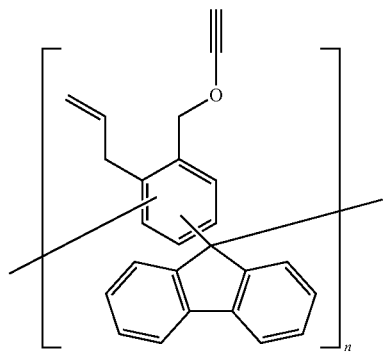

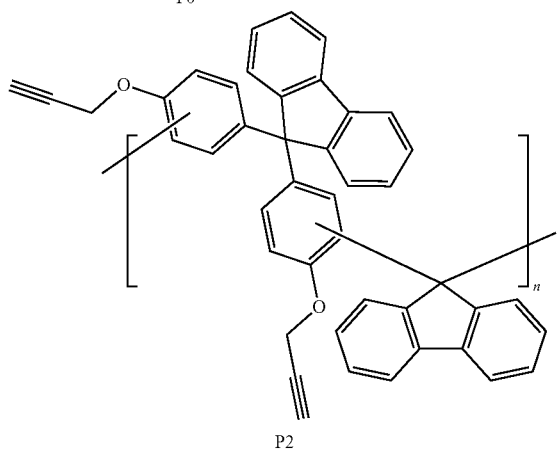

P2

Preparation Example 1 of Composition 1

P1 (13.9 parts) and Megafac R-41 (0.1 parts, DIC Corporation) are added into propylene glycol 1-monomethyl ether 2-acetate (PGMEA) (86 parts), and the mixture is stirred for 1 hour at room temperature. It is visually confirmed that the solutes are completely dissolved.

The resultant is filtered through a filter made of a 0.2 μm fluororesin (Merck Millipore, SLFG025NS) to obtain Composition 1.

Preparation Example 2 of Composition 2

P2 (11.9 parts) and Megafac R-41 (0.1 parts) are added into PGMEA (88 parts), and the mixture is stirred for 1 hour at room temperature. It is visually confirmed that the solutes are completely dissolved.

The resultant is filtered through a filter made of a 0.2 μm fluororesin to obtain Composition 2.

Preparation Example 3 of Composition 3

P3 (13.9 parts) having the structure shown below and Megafac R-41 (0.1 parts) are added into PGMEA (86 parts), and the mixture is stirred for 1 hour at room temperature. It is visually confirmed that the solutes are completely dissolved.

The resultant is filtered through a filter made of a 0.2 μm fluororesin to obtain Composition 3.

P3

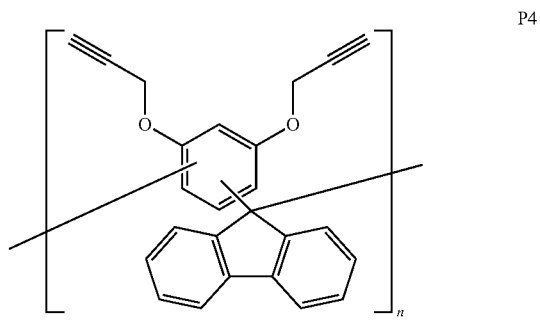

Preparation Example 4 of Composition 4

P4 (14.9 parts) having the structure shown below and Megafac R-41 (0.1 parts) are added into PGMEA (85 parts), and the mixture is stirred for 1 hour at room temperature. It is visually confirmed that the solutes are completely dissolved.

The resultant is filtered through a filter made of a 0.2 μm fluororesin to obtain Composition 4.

P4

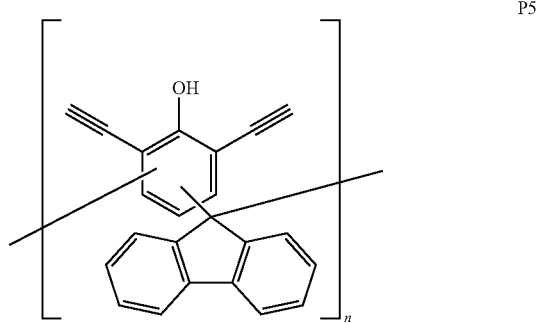

Preparation Example 5 of Composition 5

P5 (14.9 parts) having the structure shown below and Megafac R-41 (0.1 parts) are added into PGMEA (85 parts), and the mixture is stirred for 1 hour at room temperature. It is visually confirmed that the solutes are completely dissolved.

The resultant is filtered through a filter made of a 0.2 μm fluororesin to obtain Composition 5.

P5

Preparation Example 6 of Composition 6

P6 (13.9 parts) having the structure shown below and Megafac R-41 (0.1 parts) are added into PGMEA (86 parts), and the mixture is stirred for 1 hour at room temperature. It is visually confirmed that the solutes are completely dissolved.

The resultant is filtered through a filter made of a 0.2 μm fluororesin to obtain Composition 6.

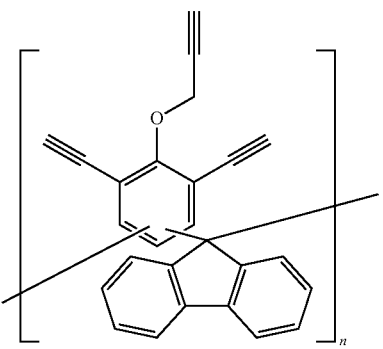

P6

Preparation Example 7 of Composition 7

The above-described P0 (24.9 parts) and Megafac R-41 (0.1 parts) are added into PGMEA (75 parts), and the mixture is stirred for 1 hour at room temperature. It is visually confirmed that the solutes are completely dissolved.

The resultant is filtered through a filter made of a 0.2 μm fluororesin to obtain Composition 7.

Preparation Example 8 of Composition 8

P7 (12.9 parts) having the structure shown below, P8 (1 parts) having the structure shown below and Megafac R-41 (0.1 parts) are added into PGMEA (87 parts), and the mixture is stirred for 1 hour at room temperature. It is visually confirmed that the solutes are completely dissolved.

The resultant is filtered through a filter made of a 0.2 μm fluororesin to obtain Composition 8.

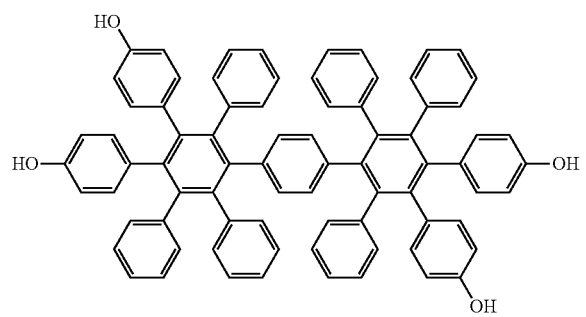

P7

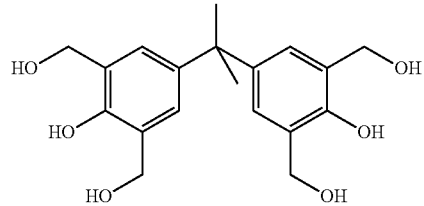

P8

Preparation Example 9 of Composition 9

P2 (8.9 parts), P9 (5 parts) having the structure shown below and Megafac R-41 (0.1 parts) are added into PGMEA (85 parts), and the mixture is stirred for 1 hour at room temperature. It is visually confirmed that the solutes are completely dissolved.

The resultant is filtered through a filter made of a 0.2 μm fluororesin to obtain Composition 9.

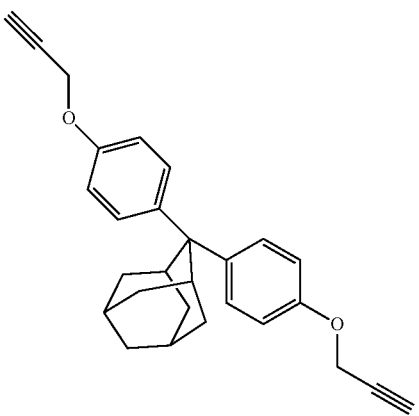

P9

Preparation Example 10 of Composition 10

P2 (2.9 parts) and Megafac R-41 (0.1 parts) are added into PGMEA (97 parts), and the mixture is stirred for 1 hour at room temperature. It is visually confirmed that the solutes are completely dissolved.

The resultant is filtered through a filter made of a 0.2 μm fluororesin to obtain Composition 10.

Preparation Example 11 of Composition 11

P2 (3.9 parts) and Megafac R-41 (0.1 parts) are added into PGMEA (96 parts), and the mixture is stirred for 1 hour at room temperature. It is visually confirmed that the solutes are completely dissolved.

The resultant is filtered through a filter made of a 0.2 μm fluororesin to obtain Composition 11.

Formation of Hydrocarbon-Containing Film

Using CLEAN TRACK ACT 12 (Tokyo Electron), each composition is applied on a Si bare wafer at 1,500 rpm. The wafer is baked at 250° C. for 60 seconds in the air atmosphere, and further baked at 450° C. for 120 seconds in nitrogen atmosphere. Thereby, a hydrocarbon-containing film is obtained from each composition.

Formation of Cured Film (in the Case of Plasma Treatment)

Plasma treatment is performed with Tactras Vigus (Tokyo Electron) for 2 minutes to a wafer on which the above-described hydrocarbon-containing film is formed.

Formation of Cured Film (in the Case of Electron Beam Treatment)

1 MGy of electron beam is irradiated with EB-ENGINE (Hamamatsu Photonics) to a wafer on which the above-described hydrocarbon-containing film is formed, while heating to 400° C.

Formation of Cured Film (in the Case of Ion Irradiation Treatment)

Carbon ion of $10^{16}$ ion/cm$^2$ is irradiated at the acceleration voltage of 10 kV to a wafer on which the above-described hydrocarbon-containing film is formed.

Measurement of Film Thickness A cross section of the wafer is made, a SEM photograph thereof is obtained with JSM-7100F (JEOL), and the film thickness is measured.

Measurement of Film Density

By high-resolution X-ray reflectivity measurement using an automated multipurpose X-ray diffractometer SmartLab (Rigaku), the film density is calculated by fitting the simulation curve in the conditions of Anti-cathode: Cu, output voltage and current: 45 kV×200 mA, angular range: 0.2 to 3.0°, and measurement step: 0.002°; to the obtained X-ray reflectivity curve.

Measurement of Film Hardness

Using an indentation hardness tester ENT-2100 (Elionix), the film hardness is calculated under the conditions of an indentation load: 10 μN, the number of measurements: 100 times, and the step interval: 100 ms.

Measurement of $I_D/I_G$

Using the Triple Raman Laser Spectrometer RAMANOR T64000 (Horiba Joban Yvon), the $I_D/I_G$ in Raman spectroscopy is measured at the laser wavelength of 514.5 nm.

Based on the Gaussian function, the broad peak appearing at around 900 to 1,800 cm$^{-1}$ is separated into three, which are a G band at around 1,590 cm$^{-1}$, a D band at around 1,350 cm$^{-1}$ and a band at around 1,100 cm$^{-1}$, and intensity of the D band and the G band are calculated. Thereby, $I_D/I_G$ is calculated.

Measurement of Etching Resistance

Using an etching system NE-5000N (ULVAC), dry etching is performed under the conditions of chamber pressure: 0.17 mT, RF power: 200 W, gas flow rate: CF$_4$ (50 sccm), Ar (35 sccm) and O$_2$ (4 sccm), and time: 30 seconds.

The film thickness before etching and the film thickness after etching are measured as described in the above "Measurement of film thickness" to obtain the difference between the former and the latter, and the amount of reduction in film thickness per unit time is calculated.

Evaluation Results

The evaluation results are described in Table 1 below.

[Table 1]

TABLE 1

|  | Film thickness (nm) | | Film density (g/cm³) | | Film hardness (GPa) | | $I_D/I_G$ | Etching resistance (nm/min) |
| --- | --- | --- | --- | --- | --- | --- | --- | --- |
|  | before treatment | after treatment | before treatment | after treatment | before treatment | after treatment | after treatment | after treatment |
| Composition 1 | 224 | 75 | 1.2 | 1.4 | 1.1 | 2.7 | 0.62 | 172 |
| Composition 2 | 236 | 85 | 1.2 | 1.5 | 0.8 | 2.8 | 0.58 | 164 |
| Composition 3 | 223 | 94 | 1.2 | 1.6 | 0.8 | 3.0 | 0.50 | 153 |
| Composition 4 | 212 | 98 | 1.2 | 1.6 | 1.0 | 3.0 | 0.52 | 149 |
| Composition 5 | 216 | 77 | 1.2 | 1.5 | 0.8 | 2.7 | 0.51 | 150 |
| Composition 6 | 213 | 92 | 1.2 | 1.6 | 0.8 | 3.0 | 0.49 | 149 |
| Composition 7 | 232 | 83 | 1.2 | 1.2 | 0.9 | 2.5 | 0.71 | 164 |
| Composition 8 | 243 | 88 | 1.2 | 1.2 | 0.9 | 2.6 | 0.85 | 149 |
| Composition 9 | 238 | 97 | 1.2 | 1.6 | 0.9 | 2.7 | 0.84 | 132 |
| Composition 10 | 53 | 42 | 1.2 | 1.4 | 1.1 | 1.9 | 0.75 | 183 |
| Composition 11 | 71 | 60 | 1.2 | 1.3 | 1.0 | 4.5 | 0.54 | 168 |

In the above table:

regarding Compositions 1 to 9, "before treatment" means a result of evaluating a hydrocarbon-containing film before the plasma treatment, and "after treatment" means a result of evaluating a cured film after the plasma treatment;

regarding Composition 10, "before treatment" means a result of evaluating a hydrocarbon-containing film before the electron beam irradiation, and "after treatment" means a result of evaluating a cured film after the electron beam irradiation; and regarding Composition 11, "before treatment" means a result of evaluating a hydrocarbon-containing film before the ion irradiation, and "after treatment" means a result of evaluating a cured film after the ion beam irradiation.

Comparative Example, Evaluation of Etching Resistance of Hydrocarbon-Containing Film The etching resistance of the hydrocarbon-containing film before the plasma treatment of Composition 2 is measured in the same manner as described above. The etching resistance is 204 nm/min.

Comparing the etching resistance of the hydrocarbon-containing film (before the plasma treatment) and the cured film (after the plasma treatment) obtained from Composition 2, the former is easily etched by about 24%.

The invention claimed is:

1. A method for manufacturing a resist layer above a cured film comprising:
   (1) applying a composition (i) above a substrate;
   (2) forming a hydrocarbon-containing film from the composition (i); and
   (3) irradiating the hydrocarbon-containing film with plasma, electron beam and/or ion to form a cured film,
   provided that the composition (i) comprises a hydrocarbon-containing compound (A) and a solvent (B); and
   the hydrocarbon-containing compound (A) comprises a structural unit (A1-1) represented by the following formula (A1-1):

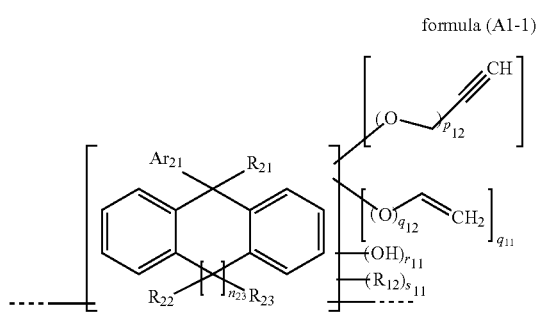

formula (A1-1)

wherein,
$Ar_{21}$ is a $C_{6-50}$ aromatic hydrocarbon group;
$R_{21}$ is a $C_{6-50}$ aromatic hydrocarbon group, hydrogen, or a single bond bonded to another structural unit;
$n_{21}$ is 0;
wherein $R_{22}$ and $R_{23}$ are not present;
wherein a single bond connects the two phenyl rings;
where, $Ar_{21}$, and $R_{21}$ contain no fused aromatic ring;
$R_{12}$ is I, Br or CN; $p_{11}$ is a number of 0 to 5, $p_{12}$ is a number of 0 to 1, $q_{11}$ is 0, $r_{11}$ is a number of 0 to 5, $s_{11}$ is a number of 0 to 5; and
$p_{11}$, $q_{11}$ and $r_{11}$ do not become 0 simultaneously in one structural unit;
where, the intensity ratio of G band and D band $R=I_D/I_G$ in Raman spectroscopy (measured with laser wavelength of 514.5 nm) of the cured film formed in the process (3) is 0.35 to 0.90;
wherein the hydrocarbon-containing compound (A) is a polymer comprising an aldehyde derivative when the polymer is synthesized from 0 to 30 mol % based on the sum of all components used in the synthesis;
wherein the process (3) comprises the following conditions:
   in the case of plasma irradiation:
      the atmosphere is $N_2$, NF3, $H_2$, fluorocarbon, rare gas, or a mixture of any of these; and/or
      the RF discharge power is 1,000 to 10,000 W,
   in the case of electron beam irradiation:
      the acceleration voltage is 2 to 200 kV, and/or
      the irradiation amount is 100 to 5,000 kGy,
   in the case of ion irradiation:
      the elemental species of the ion to be irradiated is hydrogen, boron, carbon, nitrogen, rare gas, or a mixture of any of these;
      the acceleration voltage is 3 to 1000 kV; and/or
      the irradiation amount is $10^{13}$ to $10^{18}$ ion/cm².

2. The method for manufacturing a cured film according to claim 1, wherein the molecular weight of the hydrocarbon-containing compound (A) is 500 to 6,000.

3. The method for manufacturing a resist layer according to claim 1, wherein the composition (i) further comprises a surfactant (C) or an additive (D); where, the additive (D) comprises a crosslinking agent, a high carbon material, an acid generator, a radical generator, a photopolymerization initiator, a substrate adhesion enhancer, or a mixture of any of these.

4. The method for manufacturing a resist layer according to claim 1, wherein the solvent (B) comprises an organic solvent;
where, the organic solvent comprises a hydrocarbon solvent, an ether solvent, an ester solvent, an alcohol solvent, a ketone solvent, or a mixture of any of these.

5. The method for manufacturing a resist layer according to claim 1,
wherein, the content of the hydrocarbon-containing compound (A) is 2 to 30 mass % based on the composition (i);
the content of the solvent (B) is 60 to 98 mass % based on the composition (i);
the content of the surfactant (C) is 0.01 to 10 mass % based on the hydrocarbon-containing compound (A); or
the content of the additive (D) is 0.05 to 100 mass % based on the hydrocarbon-containing compound (A).

6. The method for manufacturing a resist layer according to claim 1, wherein the polymer essentially does not contain secondary or tertiary carbon atoms in its main chain.

7. The method for manufacturing a resist layer according to claim 1, wherein in the cured film formed in the process (3), the film density is increased by to 75% or the film hardness is increased by 50 to 500%, as compared with the hydrocarbon-containing film formed in the process (2).

8. The method for manufacturing a resist layer according to claim 1, wherein the hydrocarbon-containing film formed in the process (2) is more easily etched by 5 to 200% than the cured film formed in the process (3); or the surface resistivity of the cured film formed in the process (3) is $10^9$ to $10^{16}Ω$.

9. The method for manufacturing a resist layer according to claim 1, wherein the heating conditions in process (2) are 80 to 800° C. and for 30 to 180 seconds.

10. The method for manufacturing a resist layer according to claim 1, wherein
the cured film has the film density of 1.3 to 3.2 g/cm³; or
the cured film has the film hardness of 1.5 to 20 GPa.

11. A method for manufacturing a resist pattern by exposing and developing the resist layer according to claim 1.

12. A method for manufacturing a device comprising the method according to claim 1.

13. The method for manufacturing a resist layer according to claim 1,
wherein a cured film has a diamond-like carbon structure.

* * * * *